(12) United States Patent
Masamori et al.

(10) Patent No.: US 10,115,632 B1
(45) Date of Patent: Oct. 30, 2018

(54) THREE-DIMENSIONAL MEMORY DEVICE HAVING CONDUCTIVE SUPPORT STRUCTURES AND METHOD OF MAKING THEREOF

(71) Applicant: SANDISK TECHNOLOGIES LLC, Plano, TX (US)

(72) Inventors: Yohei Masamori, Yokkaichi (JP); Hiroyuki Ogawa, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/489,050

(22) Filed: Apr. 17, 2017

(51) Int. Cl.
| | |
|---|---|
| H01L 27/115 | (2017.01) |
| H01L 21/768 | (2006.01) |
| H01L 27/11524 | (2017.01) |
| H01L 27/11556 | (2017.01) |
| H01L 27/11529 | (2017.01) |
| H01L 27/1157 | (2017.01) |
| H01L 27/11582 | (2017.01) |
| H01L 27/11573 | (2017.01) |

(Continued)

(52) U.S. Cl.
CPC .. *H01L 21/76877* (2013.01); *H01L 21/76816* (2013.01); *H01L 23/5226* (2013.01); *H01L 23/5283* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC ......... H01L 21/76877; H01L 21/76816; H01L 23/5226; H01L 27/1157; H01L 27/11573
See application file for complete search history.

(56) References Cited

U.S. PATENT DOCUMENTS 5,915,167 A 6/1999 Leedy
9,412,749 B1 8/2016 Shimabukuro et al.
(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Allison P Bernstein
(74) *Attorney, Agent, or Firm* — The Marbury Law Group PLLC

(57) ABSTRACT

An alternating stack of insulating layers and sacrificial material layers is formed over a horizontal layer, which can be formed over a lower-interconnect-level dielectric material layer overlying a substrate. Structural integrity of insulating layers vertically spaced from one another by backside recesses during replacement of sacrificial material layers with electrically conductive layers can be enhanced by forming electrically inactive laterally-insulated support structures concurrently with formation of laterally-insulated conductive via structures that vertically extend through each layer in the alternating stack and through the horizontal layer and to lower-interconnect-level metal interconnect structures. Alternatively or additionally, the structural integrity of insulating layers during the replacement process can be enhanced by M×N array of semiconductor-containing support structures that extend through staircase region and having same materials as memory stack structures.

11 Claims, 32 Drawing Sheets

(51) Int. Cl.
*H01L 23/522* (2006.01)
*H01L 23/528* (2006.01)

(56) References Cited

U.S. PATENT DOCUMENTS

| | | | |
|---|---|---|---|
| 9,431,415 B2* | 8/2016 | Shin | H01L 27/11578 |
| 9,455,267 B2 | 9/2016 | Zhang et al. | |
| 9,576,967 B1 | 2/2017 | Kimura et al. | |
| 9,627,403 B2 | 4/2017 | Liu et al. | |
| 2012/0098050 A1 | 4/2012 | Shim et al. | |
| 2014/0042519 A1 | 2/2014 | Lee | |
| 2015/0325588 A1 | 11/2015 | Lee et al. | |
| 2016/0049421 A1 | 2/2016 | Zhang et al. | |
| 2016/0111433 A1 | 4/2016 | Eom | |
| 2017/0040337 A1 | 2/2017 | Kim et al. | |
| 2017/0077137 A1 | 3/2017 | Kim et al. | |

OTHER PUBLICATIONS

International Searching Authority, Invitation to Pay Additional Fees and Partial International Search for PCT/US2015/048513, dated Dec. 1, 2015, 8 pages.
International Preliminary Report on Patentability from the International Bureau for International Patent Application No. PCT/US2015/048513, dated Mar. 30, 2017, 12 pages.
International Search Report and Written Opinion of the International Searching Authority for International Patent Application No. PCT/US2015/048513, dated Feb. 8, 2016, 18 pages.
U.S. Appl. No. 15/175,450, filed Jun. 7, 2016, SanDisk Technologies LLC.
U.S. Appl. No. 15/176,674, filed Jun. 8, 2016, SanDisk Technologies LLC.
U.S. Appl. No. 15/186,768, filed Jun. 20, 2016, SanDisk Technologies LLC.
U.S. Appl. No. 15/243,260, filed Aug. 22, 2016, SanDisk Technologies LLC.
U.S. Appl. No. 15/251,374, filed Aug. 30, 2016, SanDisk Technologies LLC.
U.S. Appl. No. 15/268,946, filed Sep. 19, 2016, SanDisk Technologies LLC.
U.S. Appl. No. 15/269,017, filed Sep. 19, 2016, SanDisk Technologies LLC.
U.S. Appl. No. 15/269,041, filed Sep. 19, 2016, SanDisk Technologies LLC.
U.S. Appl. No. 15/269,112, filed Sep. 19, 2016, SanDisk Technologies LLC.
U.S. Appl. No. 15/269,294, filed Sep. 19, 2016, SanDisk Technologies LLC.
U.S. Appl. No. 15/274,451, filed Sep. 23, 2016, SanDisk Technologies LLC.
U.S. Appl. No. 15/296,380, filed Oct. 18, 2016, SanDisk Technologies LLC.
U.S. Appl. No. 15/335,850, filed Oct. 27, 2016, SanDisk Technologies LLC.
U.S. Appl. No. 15/347,101, filed Nov. 9, 2016, SanDisk Technologies LLC.
U.S. Appl. No. 15/411,126, filed Jan. 20, 2017, SanDisk Technologies LLC.
Invitation to Pay Additional Fees from the International Searching Authority for International Patent Application No. PCT/US2018/018910, dated May 30, 2018, 15 pages.
International Search Report and Written Opinion of the International Searching Authority for International Patent Application No. PCT/US2018/018910, dated Jul. 26, 2018, 21 pages.

\* cited by examiner

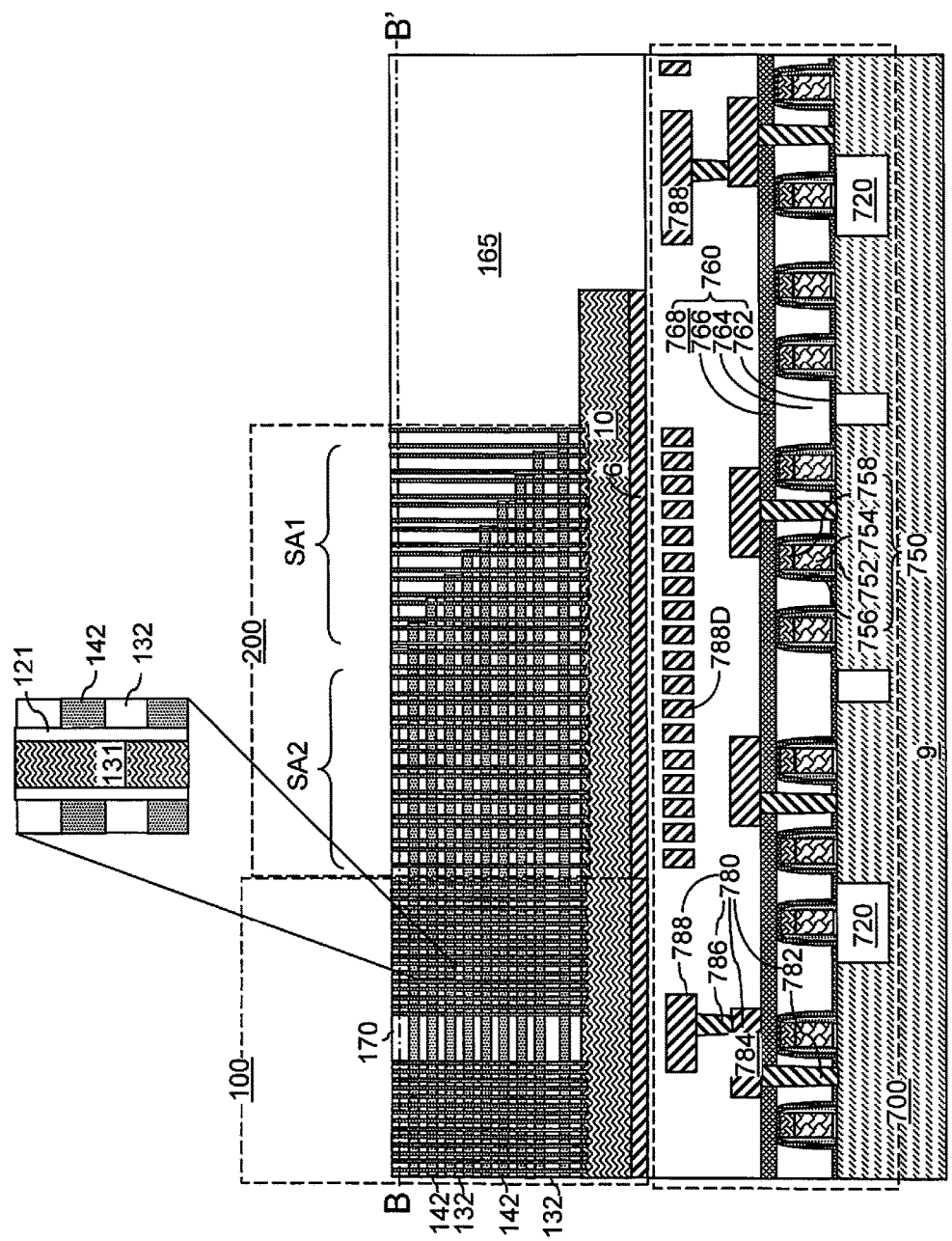

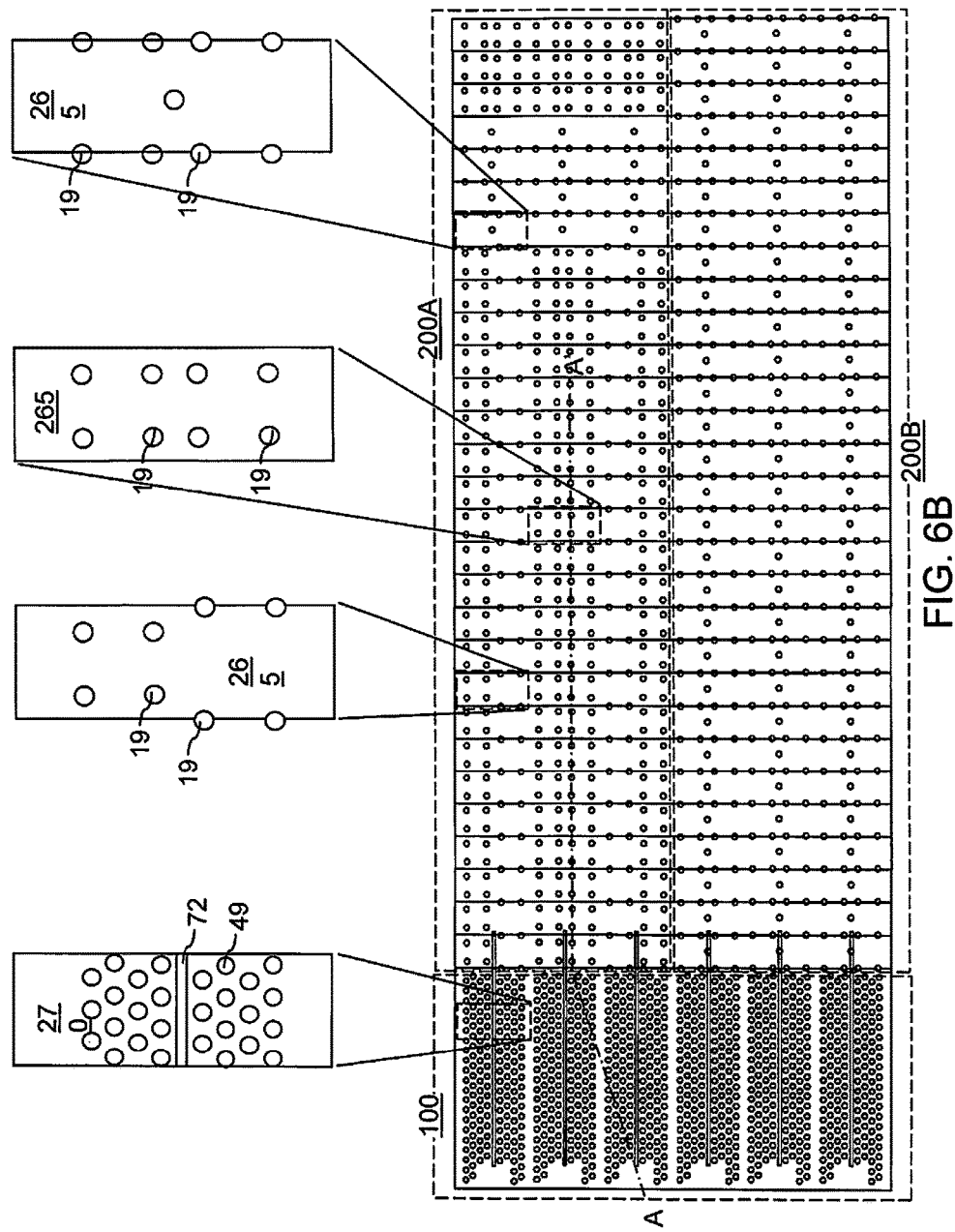

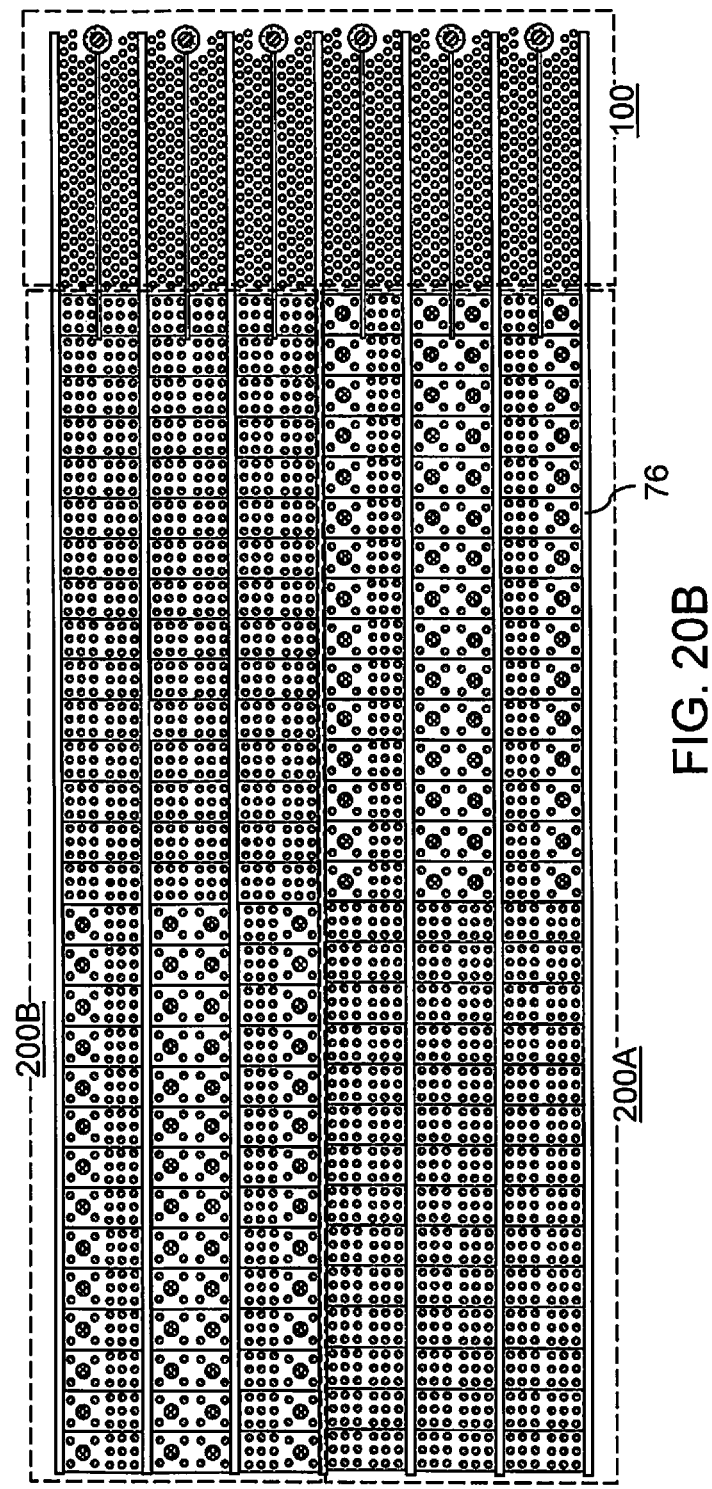

THREE-DIMENSIONAL MEMORY DEVICE HAVING CONDUCTIVE SUPPORT STRUCTURES AND METHOD OF MAKING THEREOF

FIELD

The present disclosure relates generally to the field of semiconductor devices and specifically to three-dimensional non-volatile memory devices employing support structures for replacement of sacrificial material layers and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

As three-dimensional memory devices scale to smaller device dimensions, the dimensions of various layers shrink, thereby decreasing structural stability of layers between backside recesses formed by removal of sacrificial material layers that are provided between insulating layers. Thus, a method of enhancing structural support during replacement of the sacrificial material layers with electrically conductive layers is desired.

SUMMARY

According to an aspect of the present disclosure, a three-dimensional memory device is provided, which comprises: a lower-interconnect-level dielectric material layer located over a substrate and embedding lower-interconnect-level metal interconnect structures; a horizontal layer overlying the lower-interconnect-level dielectric material layer; an alternating stack of insulating layers and electrically conductive layers located over the horizontal layer; an array of memory stack structures extending through the alternating stack; laterally-insulated conductive via structures that vertically extend through each layer in the alternating stack and through the horizontal layer, wherein each of the laterally-insulated conductive via structures comprises a respective first conductive core that is electrically shorted to a respective one of the lower-interconnect-level metal interconnect structures, and a respective first cylindrical dielectric spacer that laterally surrounds the respective first conductive core; and laterally-insulated support structures that vertically extend through a subset of layers in the alternating stack, wherein each of the laterally-insulated support structures comprises a respective second conductive core having a same composition as the first conductive core, and a respective second cylindrical dielectric spacer that laterally surrounds the respective second conductive core, and wherein an entirety of a top planar surface of each second conductive core contacts a respective bottom surface of an overlying upper-interconnect-level dielectric material layer.

According to another aspect of the present disclosure, a three-dimensional memory device is provided, which comprises: a lower-interconnect-level dielectric material layer located over a substrate and embedding lower-interconnect-level metal interconnect structures; a horizontal layer overlying the lower-interconnect-level dielectric material layer; an alternating stack of insulating layers and electrically conductive layers located over the horizontal layer, wherein the alternating stack includes a staircase region in which each electrically conductive layer except a topmost electrically conductive layer laterally extends farther than any overlying electrically conductive layer to provide multiple sets of stepped surfaces, wherein each set of stepped surfaces continuously extend from a bottommost layer of the alternating stack to a topmost layer of the alternating stack; and a retro-stepped dielectric material portion overlies the multiple sets of stepped surfaces; an array of memory stack structures extending through the alternating stack; semiconductor-containing support structures extending through the multiple sets of stepped surfaces. Each semiconductor-containing support structure and each memory stack structure comprises a respective instance of a memory film and a respective instance of a vertical semiconductor channel that is laterally surrounded by the respective instance of the memory film and contacts a bottom surface of a respective instance of a drain region. Each horizontal surface within the multiple sets of stepped surfaces includes an M×N array of openings, wherein M is an integer greater than 2 and N is an integer greater than 1. The three-dimensional memory device further comprises an instance of an M×N array of semiconductor-containing support structures that is a subset of the semiconductor-containing support structures extends vertically through each opening in the M×N array of openings.

According to yet another aspect of the present disclosure, a method of forming a three-dimensional memory device is provided. A lower-interconnect-level dielectric material layer embedding lower-interconnect-level metal interconnect structures is formed over a substrate. A horizontal layer is formed over the lower-interconnect-level dielectric material layer. An alternating stack of insulating layers and sacrificial material layers is formed over the horizontal layer. A staircase region is formed, in which each sacrificial material layer except a topmost sacrificial material layer laterally extends farther than any overlying sacrificial material layer to provide multiple sets of stepped surfaces, wherein each set of stepped surfaces continuously extend from a bottommost layer of the alternating stack to a topmost layer of the alternating stack. An array of memory stack structures extending through the alternating stack is formed. Laterally-insulated conductive via structures are formed, which vertically extend through each layer in the alternating stack and through the horizontal layer. Laterally-insulated support structures are formed, which vertically extend through a subset of layers in the staircase region of the alternating stack, wherein the laterally-insulated support structures vertically extend through a respective portion of the multiple sets of stepped surfaces. The sacrificial material layers within the alternating stack are replaced with electrically conductive layers while the laterally-insulated support structures provide structural support to the insulating layers during removal of the spacer material layers.

BRIEF DESCRIPTION OF THE DRAWINGS

FIG. 4A is a vertical cross-sectional view of the first exemplary structure after formation of first-tier openings and sacrificial opening fill structures therein according to the first embodiment of the present disclosure.

FIG. 6B is a horizontal cross-sectional view of the first exemplary structure along the horizontal plane B-B' in FIG. 6A. The zig-zag vertical plane A-A' corresponds to the plane of the vertical cross-sectional view of FIG. 6A.

FIG. 20B is a horizontal cross-sectional view of a second region of a second alternate embodiment of the second exemplary structure according to the second embodiment of the present disclosure.

DETAILED DESCRIPTION

Figure 1:
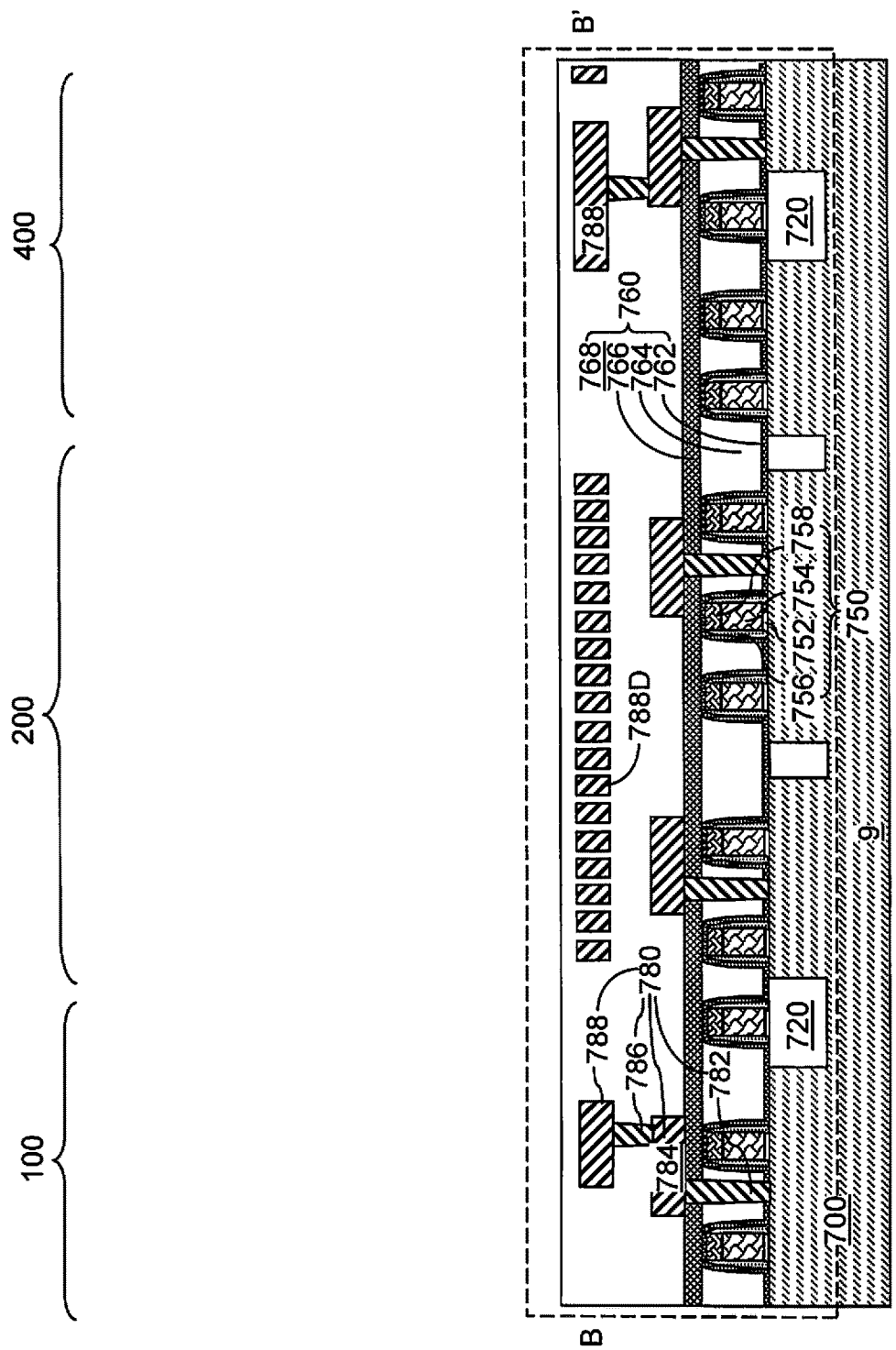
FIG. 1 is a vertical cross-sectional view of a first exemplary structure after formation of semiconductor devices, at least one lower-interconnect-level dielectric material layer, and lower-interconnect-level metal interconnect structures on a semiconductor substrate according to a first embodiment of the present disclosure. The first exemplary structure can include additional regions not expressly illustrated in FIG. 1.

As discussed above, the present disclosure is directed to three-dimensional non-volatile memory devices employing support structures for replacement of sacrificial material layers and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The semiconductor substrates may be thinned or removed from the memory levels before bonding, but as the memory levels are initially formed over separate substrates, such memories are not true monolithic three dimensional memory arrays. The semiconductor substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string memory device can be located in a monolithic, three dimensional array of NAND strings located over the semiconductor substrate. At least one memory cell in the first device level of the three dimensional array of NAND strings is located over another memory cell in the second device level of the three dimensional array of NAND strings.

Referring to FIG. 1, a first exemplary structure according to a first embodiment of the present disclosure is illustrated. The first exemplary structure includes a semiconductor substrate 9, and semiconductor devices formed thereupon. The semiconductor devices can include, for example, field effect transistors including respective source regions, drain regions, channel regions, and gate structures 750. Shallow trench isolation structures 720 can be formed in an upper portion of the semiconductor substrate 9 to provide electrical isolation among the semiconductor devices. Each gate structure 750 can include, for example, a gate dielectric 752, a gate electrode 754, a gate cap dielectric 758, and a dielectric gate spacer 756. The semiconductor devices can include any semiconductor circuitry to support operation of a memory structure to be subsequently formed, which is typically referred to as a peripheral circuitry (also called driver circuitry). As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer is formed over the semiconductor devices, which is herein referred to as at least one lower-interconnect-level dielectric material layer 760. The at least one lower-interconnect-level dielectric material layer 760 can include, for example, an optional dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower-interconnect-level metal interconnect structures 780 that provide electrical wiring among the various nodes of the semiconductor devices and landing pads for through-memory-level via structures to be subsequently formed. The lower-interconnect-level metal interconnect structures 780 can include various device contact via structures 782, lower level metal lines 784, lower level via structures 786, and lower level topmost metal structures 788 that are configured to function as landing pads for through-memory-level via structures to be subsequently formed. The region of the semiconductor devices and the combination of the at least one lower-interconnect-level dielectric material layer 760 and the lower-interconnect-level metal interconnect structures 780 is herein referred to an underlying peripheral device region 700, which is located underneath a memory-level assembly to be subsequently formed and includes peripheral devices for the memory-level assembly. The lower-interconnect-level metal interconnect structures 780 are embedded in the at least one lower-interconnect-level dielectric material layer 760. In one embodiment, the topmost surfaces of the lower level topmost metal structures 788 may be located below a horizontal plane including the topmost surface of the at least one lower-interconnect-level dielectric material layer 760.

The lower-interconnect-level metal interconnect structures 780 can be electrically shorted to nodes of the semiconductor devices, and is located at the level of the at least one lower-interconnect-level dielectric material layer 760. The through-memory-level via structures (not shown in FIG. 1) can be subsequently formed directly on the lower-interconnect-level metal interconnect structures 780. In one embodiment, the pattern of the lower-interconnect-level metal interconnect structures 780 can be selected such that the lower level topmost metal structures 788, which are a subset of the lower-interconnect-level metal interconnect structures 780 located at the topmost portion of the lower-interconnect-level metal interconnect structures 780, can provide landing pad structures within a through-memory-level via region 400. The through-memory-level via region 400 is a region in which through-memory-level via structures that extend vertically through a memory-level assembly is subsequently formed.

The semiconductor devices formed on the top surface of the semiconductor substrate 9 can include a driver circuit for the array of memory stack structures to be subsequently formed. A first subset of the lower-interconnect-level metal interconnect structure 788 can be electrically connected to devices of the driver circuit, and a second subset of the lower-interconnect-level metal interconnect structures (such as dummy lower-interconnect-level metal interconnect structures 788D) can be electrically isolated from any device located underneath a horizontal plane including a bottommost surface of the second subset of the lower-interconnect-level metal interconnect structures 788D. As used herein, a first element is "electrically connected" to a second element if there exists a continuous path between the first element and the second element that consists of at least one conductive material, at least one semiconducting materials, or a combination of at least one conductive material and at least one semiconducting material. As used herein, a first element is "electrically isolated" from a second element if no continuous path consisting of at least one conductive material, at least one semiconducting materials, or a combination of at least one conductive material and at least one semiconducting material is present between the first element and the second element.

The through-memory-level via region 400 can be located adjacent to a memory array region 100 in which an array of memory devices are subsequently formed. A word line contact via region 200 can be located adjacent to the through-memory-level via region 400 and the memory array region 100. In one embodiment, the through-memory-level via region 400 and the word line contact via region 200 can be located at a peripheral edge of the memory array region 100.

While a particular pattern for the lower level topmost metal structures 788 is illustrated herein, it is understood that the pattern for the lower level topmost metal structures 788 may be altered to optimize wiring in the underlying peripheral device region 700 as long as the lower level topmost metal structures 788 provide suitable landing pad areas for the through-memory-level via structures to be subsequently formed.

Figure 2:
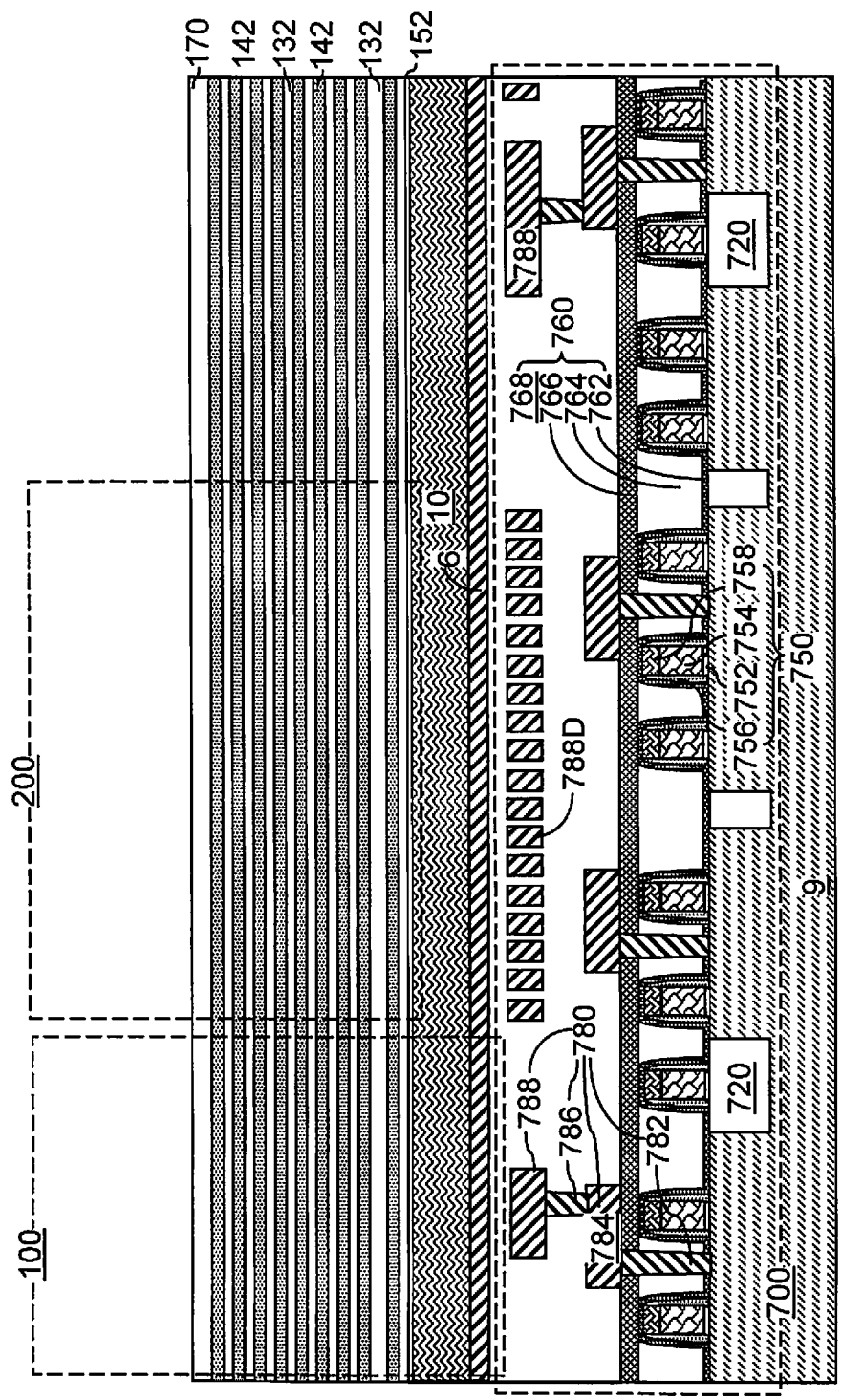
FIG. 2 is a vertical cross-sectional view of the first exemplary structure after formation of a semiconductor material layer and a first-tier alternating stack of first insulting layers and first spacer material layers according to the first embodiment of the present disclosure.

Referring to FIG. 2, an optional planar conductive material layer 6 and a horizontal layer 10 (such as a semiconductor material layer which can be a sacrificial material layer or a permanent layer which is part of a horizontal channel) can be formed over the underlying peripheral device region 700. The optional planar conductive material layer 6 includes a conductive material such as a metal or a heavily doped semiconductor material having electrical conductivity greater than $1.0 \times 10^5$ S/cm). The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6.

The semiconductor material layer 10 can be formed over the at least one lower-interconnect-level dielectric material layer 760. The semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The semiconductor material layer 10 can be formed directly above a subset of the semiconductor devices on the semiconductor substrate 9, such as a silicon wafer. As used herein, a first element is located "directly above" a second element if the first element is located above a horizontal plane including a topmost surface of the second element and an area of the first element and an area of the second element has an areal overlap in a plan view. In one embodiment, the semiconductor material layer 10 or portions thereof can be doped with electrical dopants, which may be p-type dopants or n-type dopants. The conductivity type of the dopants in the semiconductor material layer 10 is herein referred to as a first conductivity type. A dielectric pad layer 152 can be formed on the top surface of the semiconductor material layer 10.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed. The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the first insulating cap layer 170 can be in a range from 20 nm to 300 nm, although lesser and greater thicknesses can also be employed.

Figure 3A:
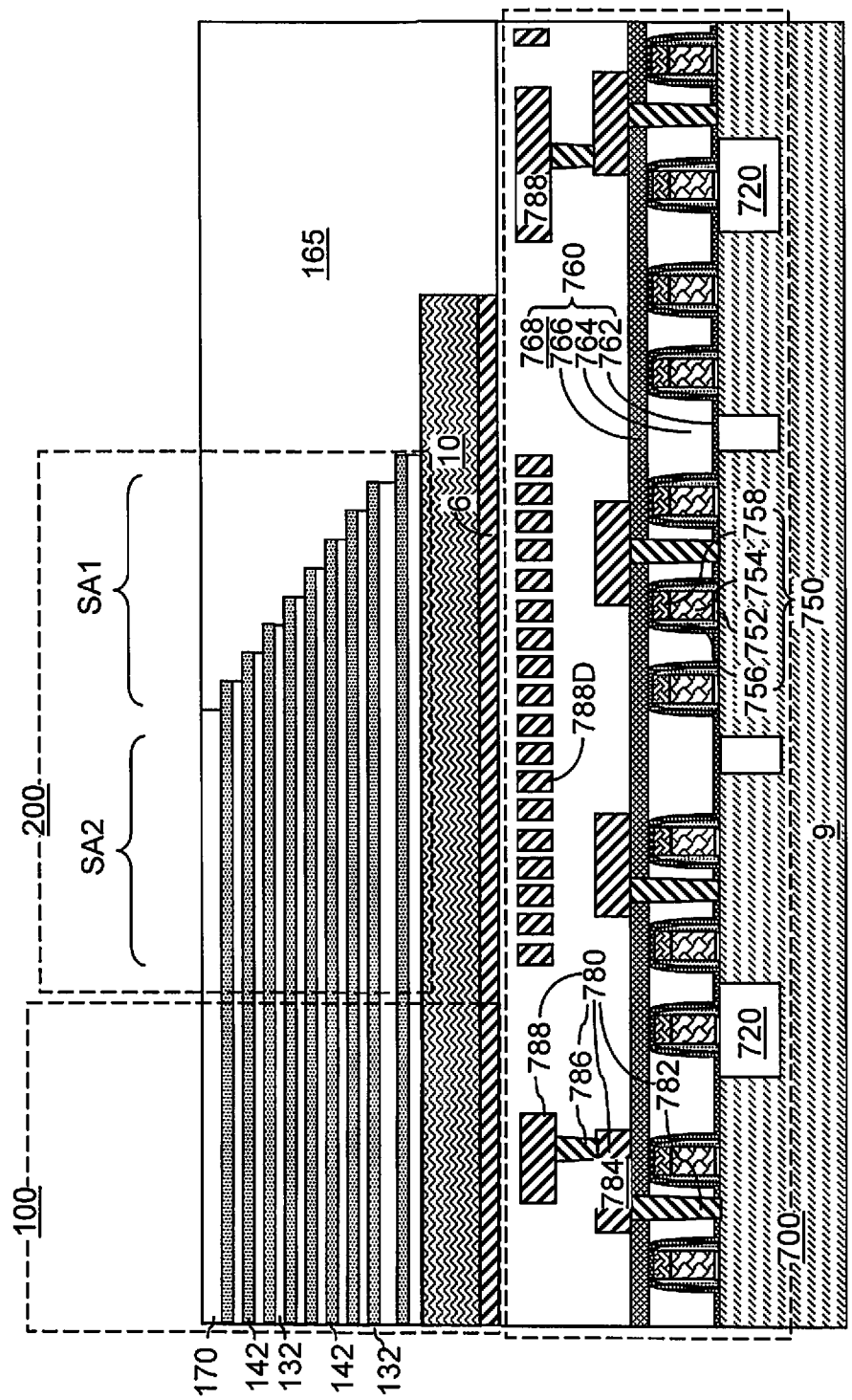
FIG. 3A is a vertical cross-sectional view of the first exemplary structure after patterning first-tier staircase regions on the first-tier alternating stack and forming a first-tier retro-stepped dielectric material portion according to the first embodiment of the present disclosure.
Figure 3B:
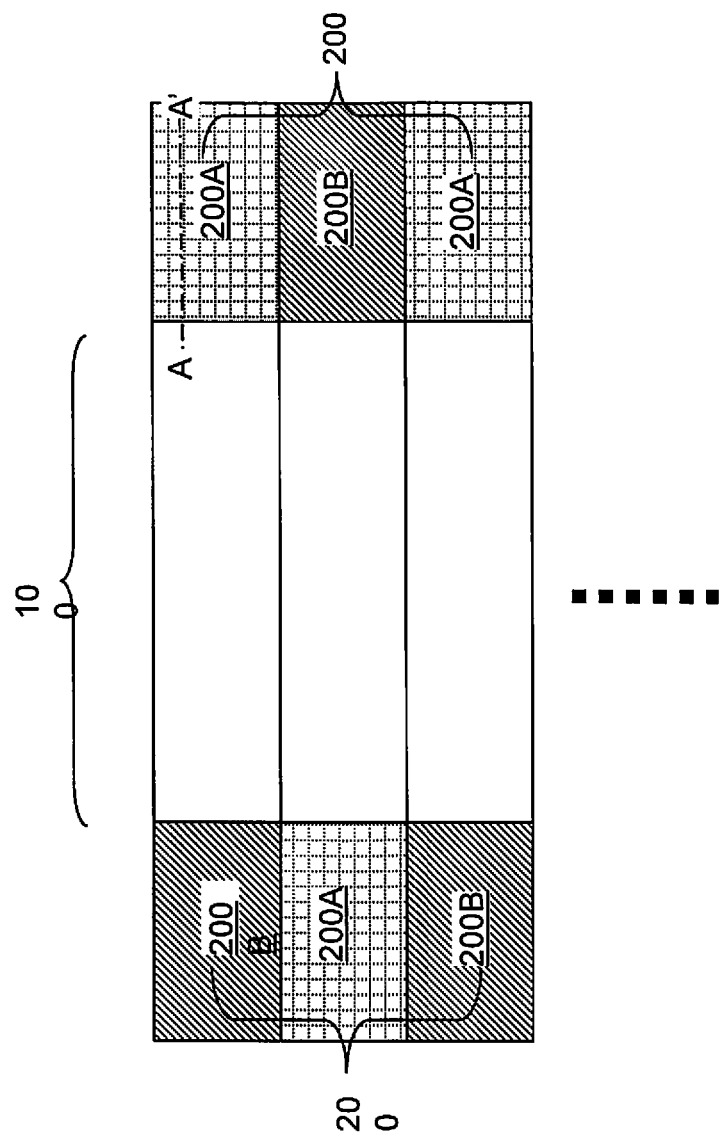
FIG. 3B is an overall plan view of the first exemplary structure of FIG. 3 that illustrates additional regions not expressly illustrated in FIG. 3A.

Referring to FIGS. 3A and 3B, the first insulating cap layer 170 and the first-tier alternating stack (132, 142) can be patterned to form first stepped surfaces in each through-memory-level via region 400 and each word line contact via region 200. The word line contact via regions 200 can include first-type word line contact via regions 200A having a first layout and second-type word line contact via regions 200B having a second layout. The first-type and second-type word line contact via regions (200A, 200B) can be alternately arranged along a pair of parallel edges of the memory array regions 100 as illustrated in FIG. 3B.

Each of the word line contact via regions 200 can include a respective first stepped area SA1 in which the first stepped surfaces are formed, and a second stepped area SA2 in which additional stepped surfaces are to be subsequently formed in a second tier structure (to be subsequently formed over a first tier structure) and/or additional tier structures. Each neighboring pair of a first stepped area SA1 and a second stepped area is herein referred to as a staircase region.

The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first tier structure, which is an in-process structure that is subsequently modified.

Figure 4B:
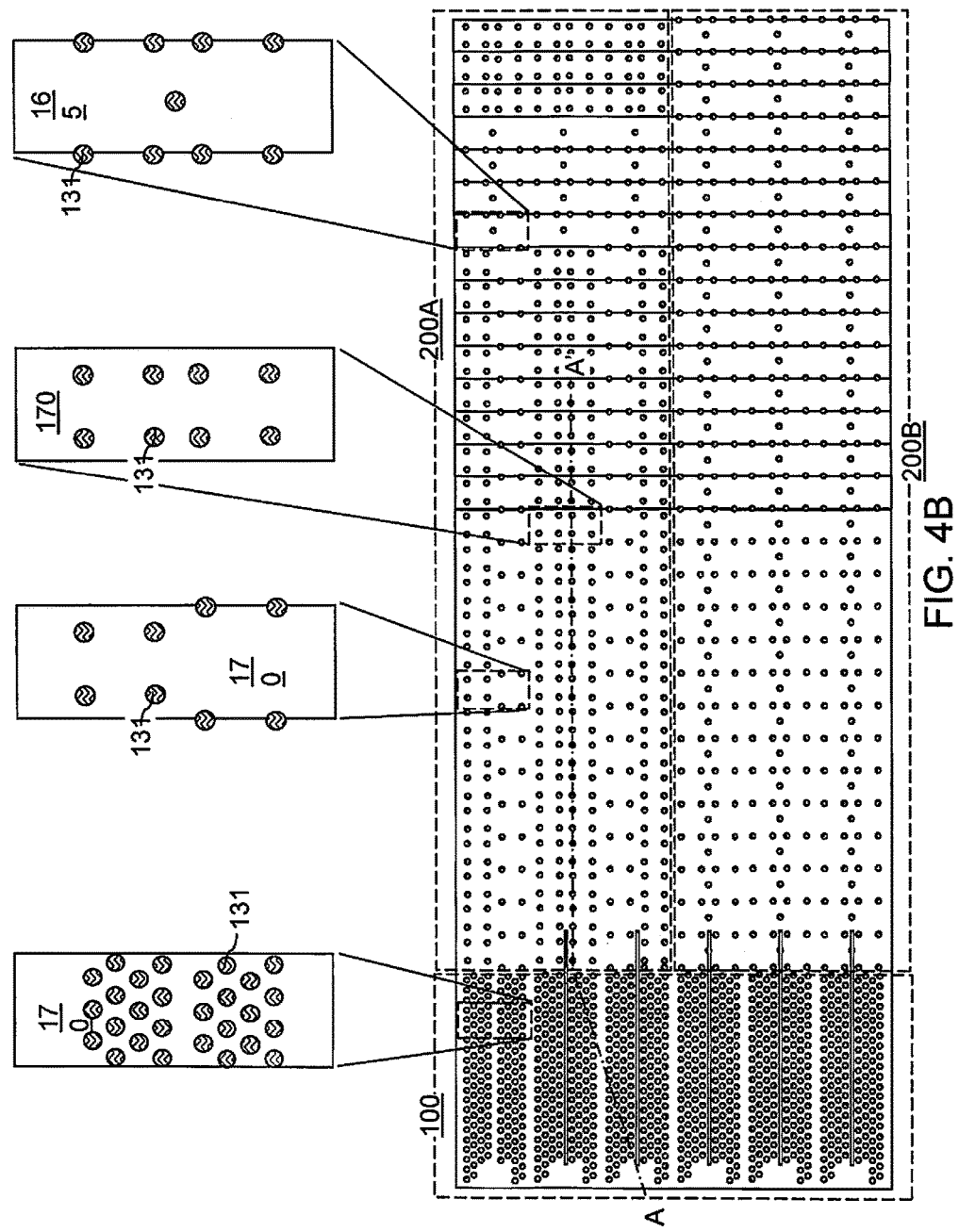
FIG. 4B is a horizontal cross-sectional view of the first exemplary structure along the horizontal plane B-B' in FIG. 4A. The zig-zag vertical plane A-A' corresponds to the plane of the vertical cross-sectional view of FIG. 4A.

Referring to FIGS. 4A and 4B, first-tier openings extending to a top surface of the semiconductor material layer 10 are formed through the first-tier alternating stack (132, 142). A first subset of the first-tier openings can be formed in the memory array region 100 at locations at which memory stack structures including vertical stacks of memory elements are to be subsequently formed. The first subset of the first-tier openings is herein referred to as first-tier memory openings. A second subset of the first-tier openings can be formed in the word line contact via regions 200 at locations at which semiconductor-containing support structures are to be subsequently formed. The second subset of the first-tier openings is herein referred to as first-tier support openings.

For example, a lithographic material stack (not shown) including at least a photoresist layer can be formed over the first insulating cap layer 170, and can be lithographically patterned to form openings within the lithographic material stack. The pattern in the lithographic material stack can be transferred through the first insulating cap layer 170 and through the entirety of the first-tier alternating stack (132, 142) by at least one anisotropic etch that employs the patterned lithographic material stack as an etch mask. Portions of the first insulating cap layer 170 and the first-tier alternating stack (132, 142) underlying the openings in the patterned lithographic material stack are etched to form the first-tier openings. In other words, the transfer of the pattern in the patterned lithographic material stack through the first insulating cap layer 170 and the first-tier alternating stack (132, 142) forms the first-tier openings.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches. The sidewalls of the first-tier openings can be substantially vertical, or can be tapered. Subsequently, the patterned lithographic material stack can be subsequently removed, for example, by ashing.

Sacrificial opening fill structures 131 can be formed in the first-tier openings. For example, a sacrificial fill material layer is deposited in the first-tier memory openings. In one embodiment, the sacrificial fill material layer can include a sacrificial material which can be subsequently removed selective to the materials of the first insulating layers 132 and the first sacrificial material layers 142. In one embodiment, the sacrificial fill material layer can include a semiconductor material such as silicon (e.g., poly silicon or amorphous silicon), a silicon-germanium alloy, germanium, a III-V compound semiconductor material, or a combination thereof. The sacrificial fill material layer may be formed by a non-conformal deposition or a conformal deposition method. In one embodiment, the sacrificial fill material layer can include a carbon-containing material (such as amorphous carbon or diamond-like carbon) that can be subsequently removed by ashing. Optionally, a thin etch stop layer 121 (such as a silicon oxide layer having a thickness in a range from 1 nm to 3 nm) may be employed prior to depositing the sacrificial fill material layer. In this case, the material of the sacrificial fill material layer can be selected from materials that can be removed selective to the material of the etch stop layer 121.

Portions of the deposited sacrificial material can be removed from above the first insulating cap layer 170. For example, the sacrificial fill material layer can be recessed to a top surface of the first insulating cap layer 170 employing a planarization process. The planarization process can include a recess etch, chemical mechanical planarization (CMP), or a combination thereof. The top surface of the first insulating layer 170 can be employed as an etch stop layer or a planarization stop layer. Each remaining portion of the sacrificial material in a first-tier memory opening constitutes a sacrificial opening fill structure 131. The sacrificial opening fill structure 131 may, or may not, include cavities therein. A first subset of the sacrificial opening fill structures 131 located in the memory array region 100 constitutes sacrificial memory opening fill structures, and a second subset of the sacrificial opening fill structures 131 located in the word line contact via regions 200 constitute sacrificial support opening fill structures.

Figure 5:
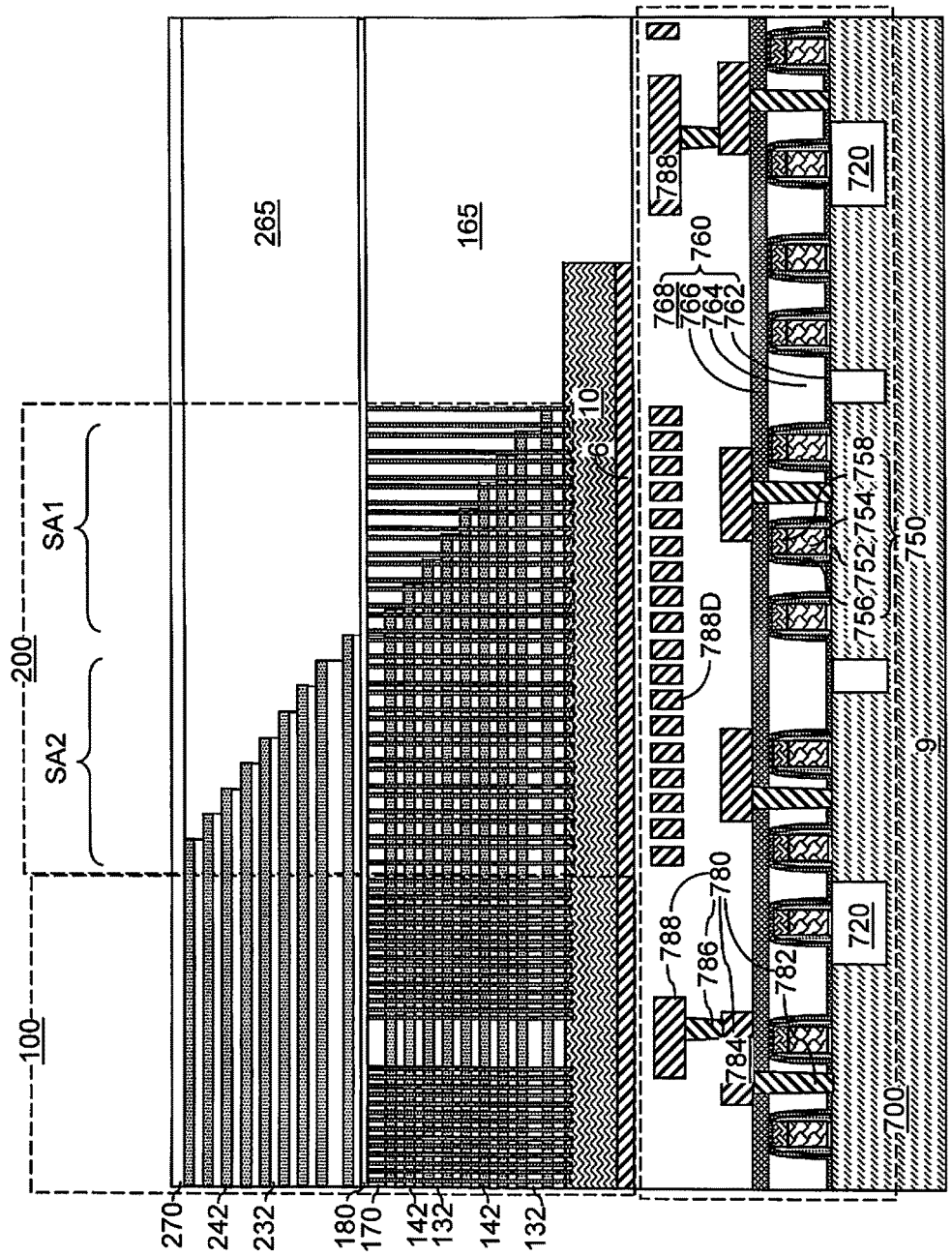
FIG. 5 is a vertical cross-sectional view of the first exemplary structure after formation of a second-tier alternating stack of second insulating layers and second spacer material layers, a second-tier retro-stepped dielectric material portion, and an insulating cap layer according to the first embodiment of the present disclosure.

Referring to FIG. 5, an inter-tier dielectric layer 180 may be optionally deposited over the first tier structure (132, 142, 165, 131). The inter-tier dielectric layer 180 includes a dielectric material such as silicon oxide. The thickness of the inter-tier dielectric layer 180 can be in a range from 30 nm to 300 nm, although lesser and greater thicknesses can also be employed.

A second tier structure can be formed over the first tier structure (132, 142, 170, 131). The second tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area SA2 can be formed in the through-memory-level via regions 400 and the word line contact via regions 200 employing a same set of processing steps as the processing steps employed to form the first stepped surfaces in the first stepped area SA1 with suitable adjustment to the pattern of at least one masking layer. A second-tier retro-stepped dielectric material portion 265 can be formed over the second stepped surfaces in the through-memory-level via regions 400 and the word line contact via regions 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the semiconductor material layer 10, and at least one retro-stepped dielectric material portion (165, 265) can be formed over the staircase regions on the at least one alternating stack (132, 142, 232, 242).

Each of the word line contact via region (200A, 200B) includes a staircase region in which each sacrificial material layer (142, 242) except a topmost sacrificial material layer 242 laterally extends farther than any overlying sacrificial material layer (142, 242) to provide a set of stepped surfaces. The set of stepped surfaces continuously extend from a bottommost layer of the first alternating stack (132, 142) to a topmost layer of the second alternating stack (232, 242).

Figure 6A:
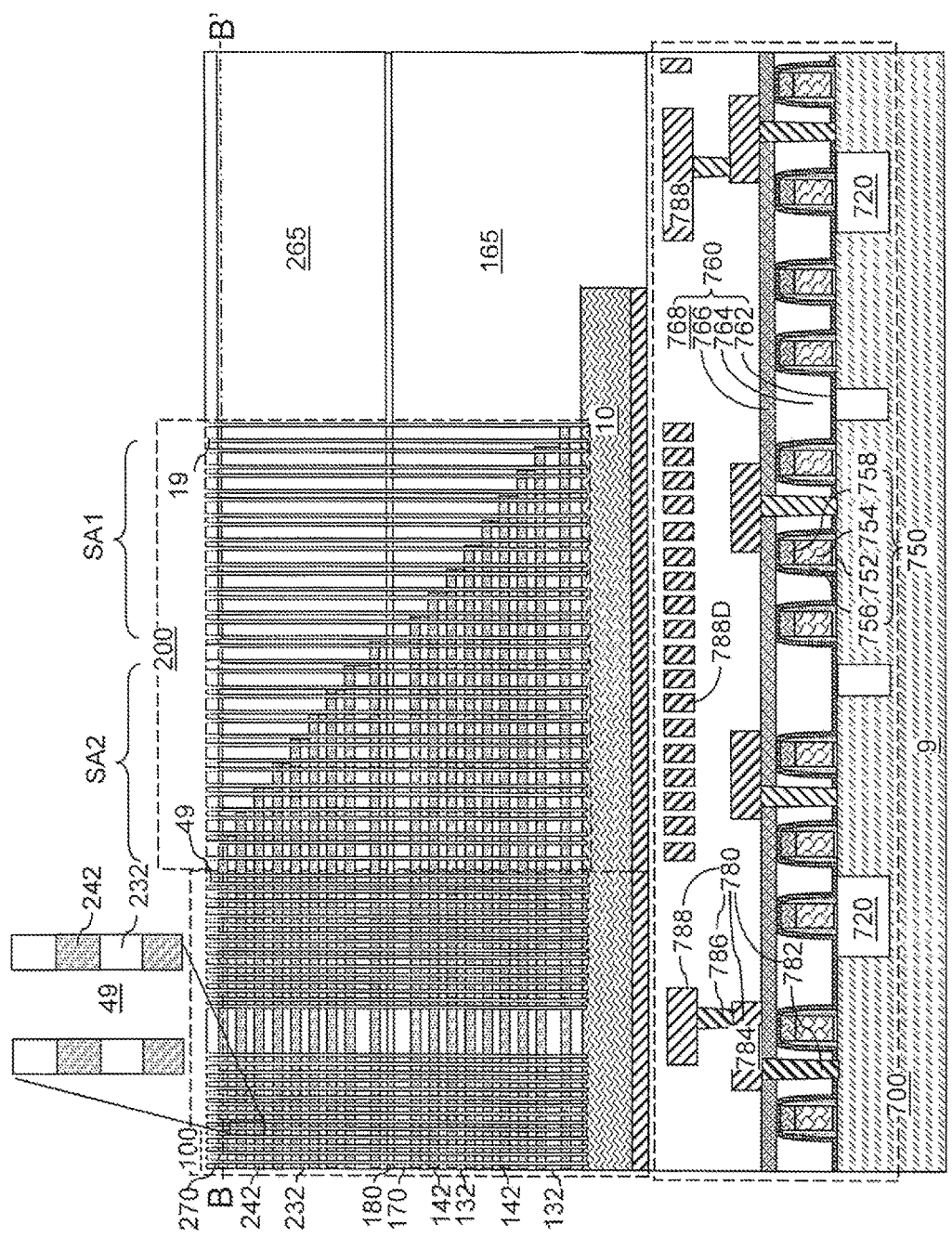
FIG. 6A is a vertical cross-sectional view of the first exemplary structure after formation of memory openings and support openings according to the first embodiment of the present disclosure.

Referring to FIGS. 6A and 6B, drain-select-level shallow trench isolation structures 72 can be optionally formed through one or more topmost second sacrificial material layers 242 by forming line trenches and filling the line trenches with a dielectric material. Second-tier openings extending through the second tier structure (232, 242, 265) are formed in areas overlying the sacrificial opening fill structures 131. A photoresist layer can be applied over the second tier structure (232, 242, 265), and can be lithographically patterned to form a same pattern as the pattern of the sacrificial opening fill structure 131, i.e., the pattern of the first-tier openings. The lithographic mask employed to pattern the first-tier openings can be employed to pattern the second-tier openings. An anisotropic etch can be performed to transfer the pattern of the lithographically patterned photoresist layer through the second tier structure (232, 242, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial opening fill structure 131 can be physically exposed at the bottom of each second-tier opening. After the top surfaces of the sacrificial opening fill structures 131 are physically exposed, a subsequent etch process can be performed, which removes the sacrificial material of the sacrificial opening fill structures 131 selective to the materials of the second-tier alternating stack (232, 242) and the first-tier alternating stack (132, 142). If any etch stop layer 121 is present, the etch stop layer 121 can be subsequently removed.

Upon removal of the sacrificial opening fill structures 131 and the optional etch stop layer 121, each vertically adjoining pair of a second-tier opening and a first-tier opening forms a continuous cavity that extends through the first-tier alternating stack (132, 142) and the second-tier alternating stack (232, 242). A first subset of the continuous cavities located in the memory array regions 100 is herein referred to as memory openings 49. A top surface of the semiconductor material layer 10 can be physically exposed at the bottom of each memory opening 49. A second subset of the continuous cavities located in the word line contact via regions 200 is herein referred to as support openings 19.

Figure 7A:
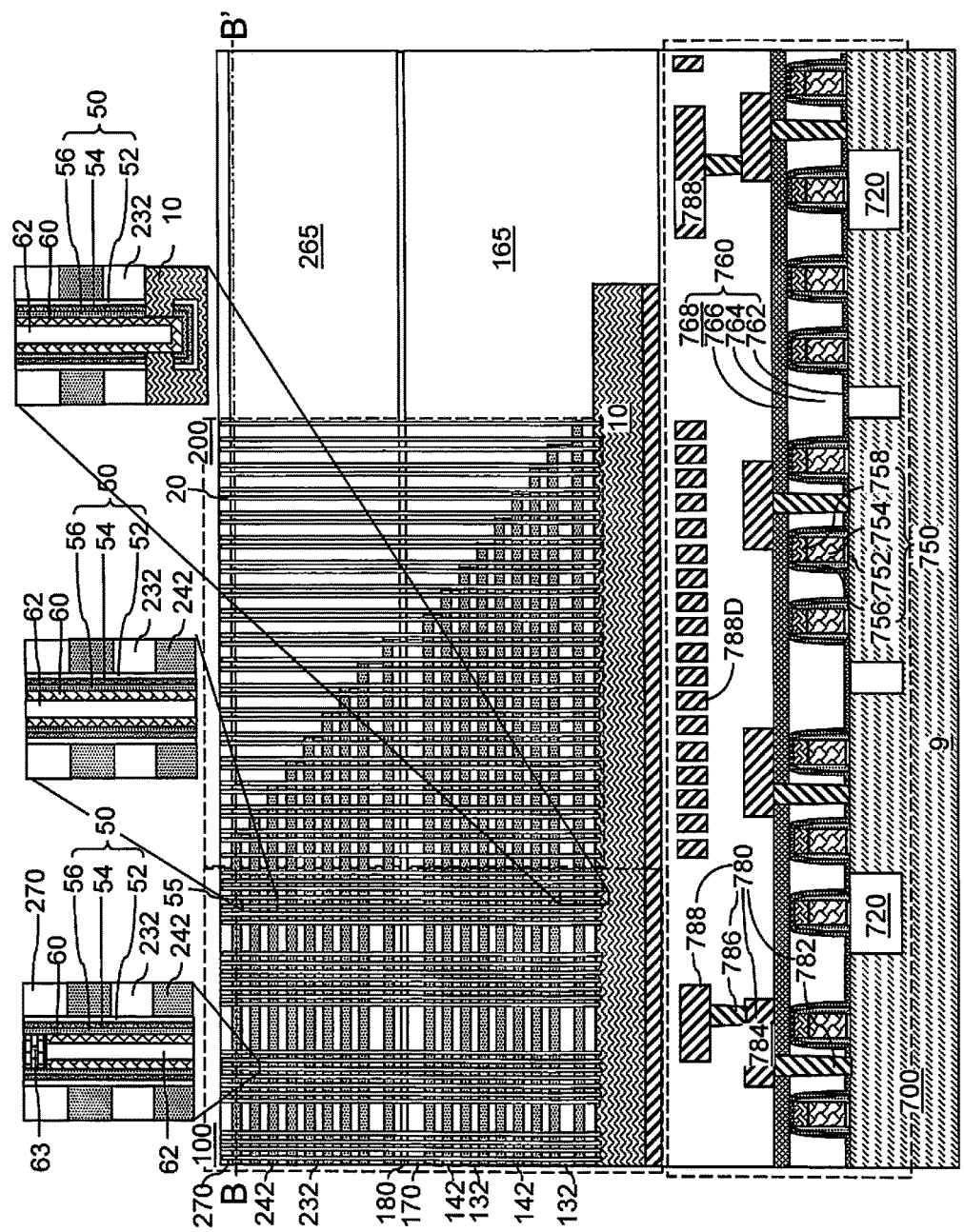
FIG. 7A is a vertical cross-sectional view of the first exemplary structure after formation of memory stack structures and semiconductor-containing support structures according to the first embodiment of the present disclosure.
Figure 7B:
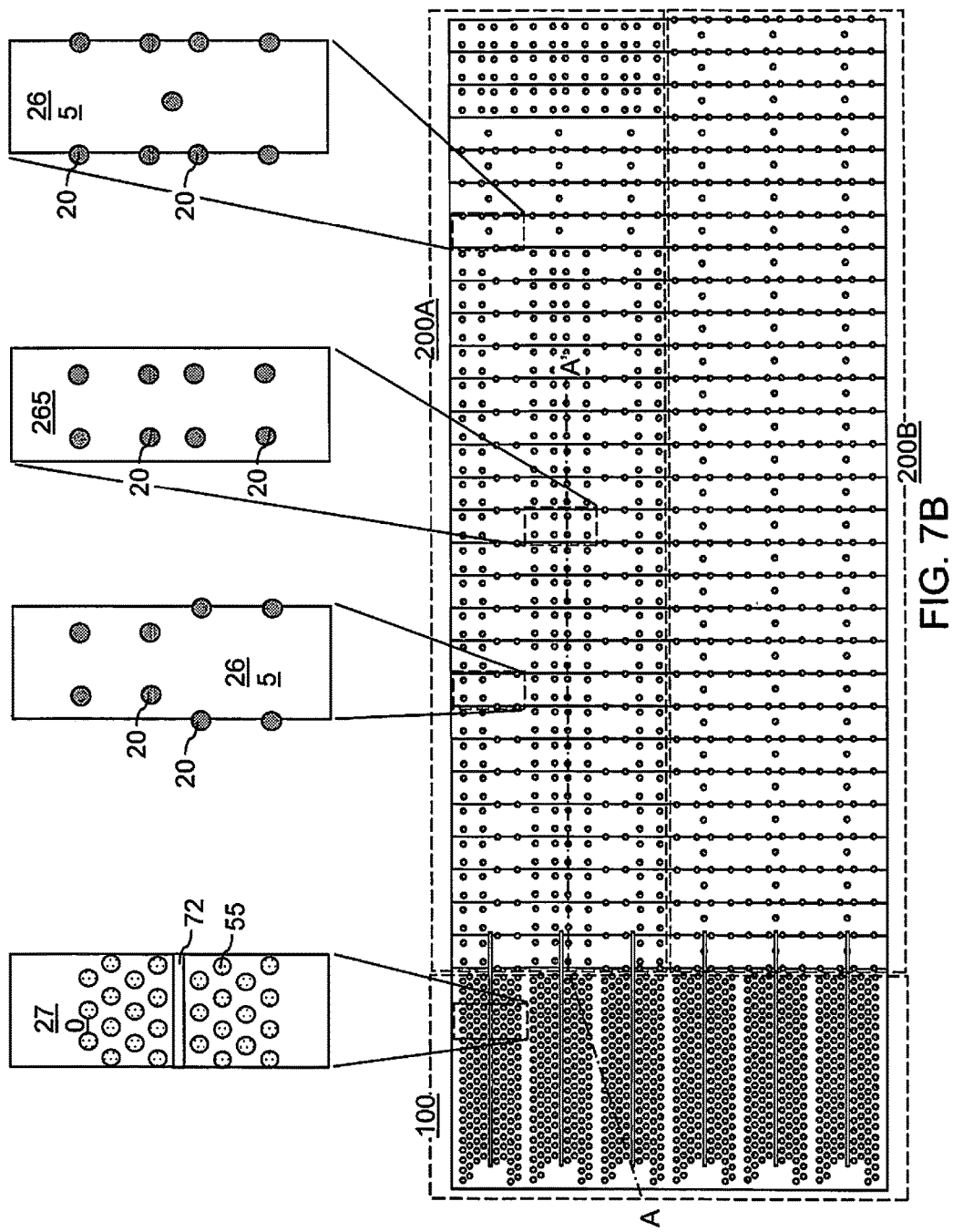
FIG. 7B is a horizontal cross-sectional view of the first exemplary structure along the horizontal plane B-B' in FIG. 7A. The zig-zag vertical plane A-A' corresponds to the plane of the vertical cross-sectional view of FIG. 7A.

Referring to FIGS. 7A and 7B, memory opening fill structures 55 can be formed in the memory openings 49, and semiconductor-containing support structures 20 can be formed in the support openings 19. The memory opening fill structures 55 and the semiconductor-containing support structures 20 can be formed simultaneously employing a same set of processing steps. In an illustrative example, each memory opening fill structure 55 and each semiconductor-containing support structure 20 can include a memory film 50, a vertical semiconductor channel 60, an optional dielectric core 62, and a drain region 63. The drain region 63 in each semiconductor-containing support structure 20 is a dummy drain region because it is not electrically connected to a bit line. In one embodiment, each memory film 50 can include a blocking dielectric layer 52, a memory material layer 54, and a tunneling dielectric layer 56 as illustrated in the inset. In one embodiment, each vertical semiconductor channel 60 can include a single vertical semiconductor channel layer or a plurality of vertical semiconductor channel layers.

The blocking dielectric layer 52 includes a blocking dielectric layer material such as silicon oxide, a dielectric metal oxide (such as aluminum oxide), or a combination thereof. Alternatively, the blocking dielectric layer 52 may be omitted during this processing step and instead be formed through backside recesses as will be described in more detail below. In one embodiment, the memory material layer 54 can be a charge trapping material including a dielectric charge trapping material, which can be, for example, silicon nitride.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. The thickness of the tunneling dielectric layer 56 can be in a range from 2 nm to 20 nm, although lesser and greater thicknesses can also be employed.

In one embodiment, the horizontal portions of the memory films 50 can be removed by an anisotropic etch process to physically expose semiconductor surfaces of the semiconductor material layer 10 from underneath each memory opening 49 and from underneath each support opening 19. In this case, a cover material layer (not shown) may be employed prior to the anisotropic etch process by a conformal deposition process. The cover material layer may be a permanent material layer such as an outer vertical semiconductor channel layer, or may be a sacrificial material layer that is removed after the anisotropic etch process. Alternatively, the anisotropic etch process may be omitted and the memory films may remain intact at this processing step.

A vertical semiconductor channel 60 can be deposited over the memory films 50 by a conformal deposition method such as low pressure chemical vapor deposition (LPCVD). The thickness of the vertical semiconductor channel 60 can be in a range from 2 nm to 30 nm, although lesser and greater thicknesses can also be employed. If semiconductor surfaces of the semiconductor material layer 10 are physically exposed from underneath each memory opening 49 and from underneath each support opening 19 by the anisotropic etch, the vertical semiconductor channel 60 can contact portions of the semiconductor material layer 10, of which upper surface portions function as horizontal semiconductor channels. If the anisotropic etch is not performed, electrical contact to a bottom portion of each vertical semiconductor channel 60 can be provided in a subsequent processing step to form a buried source line.

A dielectric material can be deposited in cavities surrounded by the vertical semiconductor channels 60, and can be subsequently recessed below the top surface of the second insulating cap layer 270. Each remaining portion of the dielectric material in the memory openings constitutes a dielectric core 62. A doped semiconductor material having a second conductivity type (which is the opposite of the first conductivity type) can be deposited over the dielectric cores 62 and within the cavities in the memory openings 49 and the support openings 19 to form drain regions 63. The doped semiconductor material can be, for example, doped polysilicon. Excess portions of the deposited semiconductor material can be removed from above the top surface of the second insulating tier cap layer 270, for example, by chemical mechanical planarization (CMP) or a recess etch to form the drain region 63.

If the anisotropic etch is not performed between formation of the memory film 50 and formation of the vertical semiconductor channels 60, electrical contact to a bottom portion of each vertical semiconductor channel 60 can be provided by forming a buried source line (not expressly shown) in place of the semiconductor material layer 10. In this embodiment, the semiconductor material layer 10 can be removed by an etch process to form line cavities to physically expose portions of the memory films 50. The exposed portions of the memory films 50 can be removed from around the line cavities to expose a bottom portion of the vertical semiconductor channels 60 (e.g., the sidewalls of the bottom portions of the semiconductor channels). The line cavities can be filled with a conductive material (e.g., heavily doped polysilicon, metal, metal nitride and/or metal silicide) contacting the exposed bottom portions of the vertical semiconductor channels 60 to provide buried source lines (not expressly shown).

Each of the memory stack structures (50, 60) comprises a memory film 50 and a vertical semiconductor channel 60 that is adjoined to a respective horizontal channel within the semiconductor material layer 10. Each memory film 50 can include a blocking dielectric layer 52 contacting a sidewall of the memory opening, a plurality of charge storage regions (embodied as portions of a memory material layer 54 at each level of the sacrificial material layers (142, 242)) located on an inner sidewall of the blocking dielectric layer 52, and a tunneling dielectric layer 56 located inside the plurality of charge storage regions.

Each combination of a memory stack structure (50, 60), an optional dielectric core, and a drain region 63 within a memory opening 49 constitutes a memory opening fill structure 55. Each combination of a memory stack structure (50, 60), an optional dielectric core, and a dummy drain region 63 within a support opening 19 constitutes a semiconductor-containing support structure 20 that includes a vertical semiconductor channel 60 as a semiconductor-containing portion. Generally speaking, any methods known in the art for forming memory opening fill structures that include memory stack structures can be employed in lieu of the specific method for forming the memory opening fill structures 55 of the present disclosure.

The first tier structure (132, 142, 170, 165), the second tier structure (232, 242, 270, 265), the memory opening fill structures 55, and the semiconductor-containing support structures 20 collectively constitute a memory-level assembly. The memory-level assembly is formed over the semiconductor material layer 10 such that the semiconductor material layer 10 includes horizontal semiconductor channels electrically connected to vertical semiconductor channels 60 within the memory stack structures (50, 60).

Figure 8A:
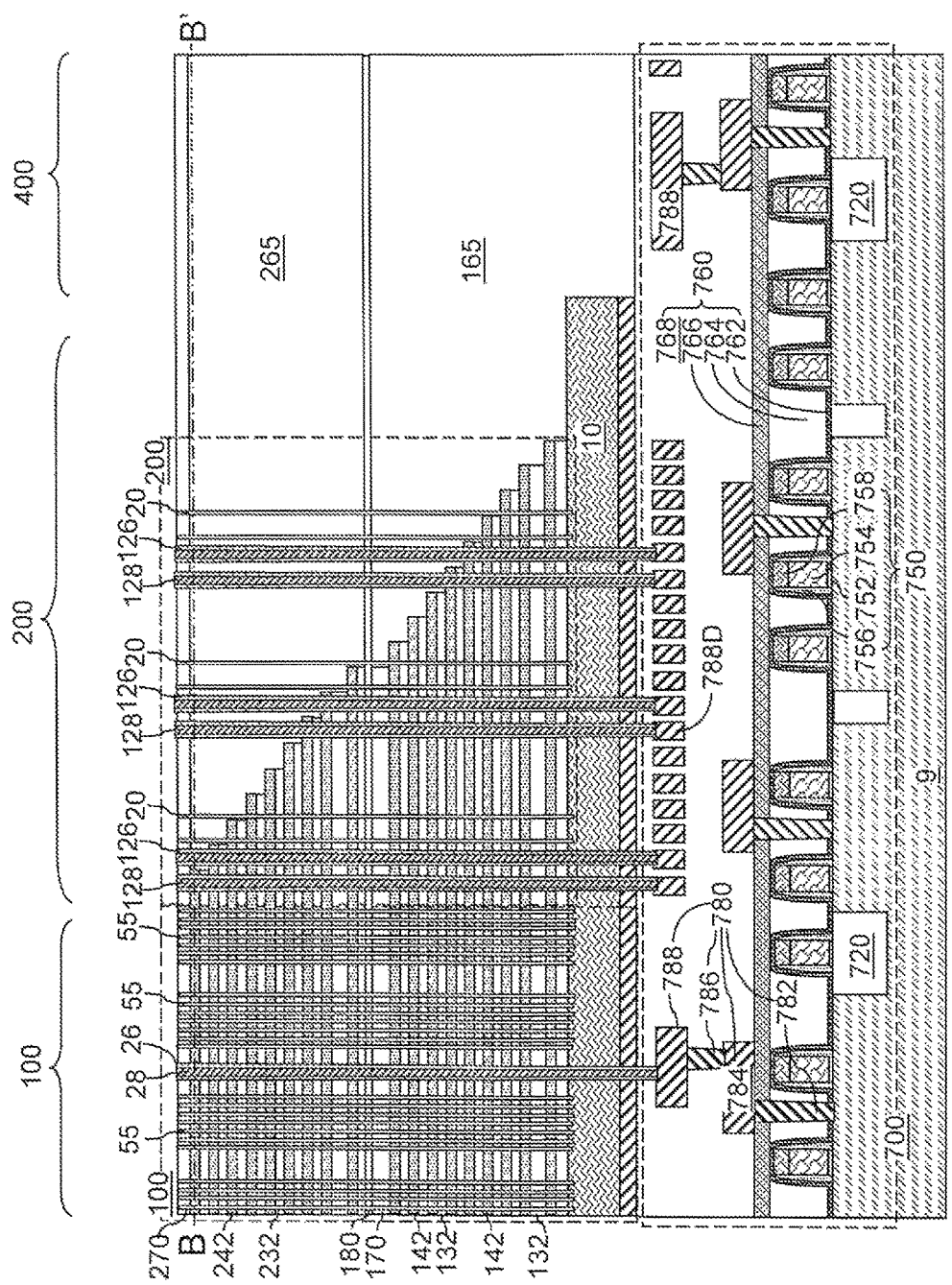
FIG. 8A is a vertical cross-sectional view of the first exemplary structure after formation of laterally-insulated conductive via structures and laterally-insulated support structures according to the first embodiment of the present disclosure.
Figure 8B:
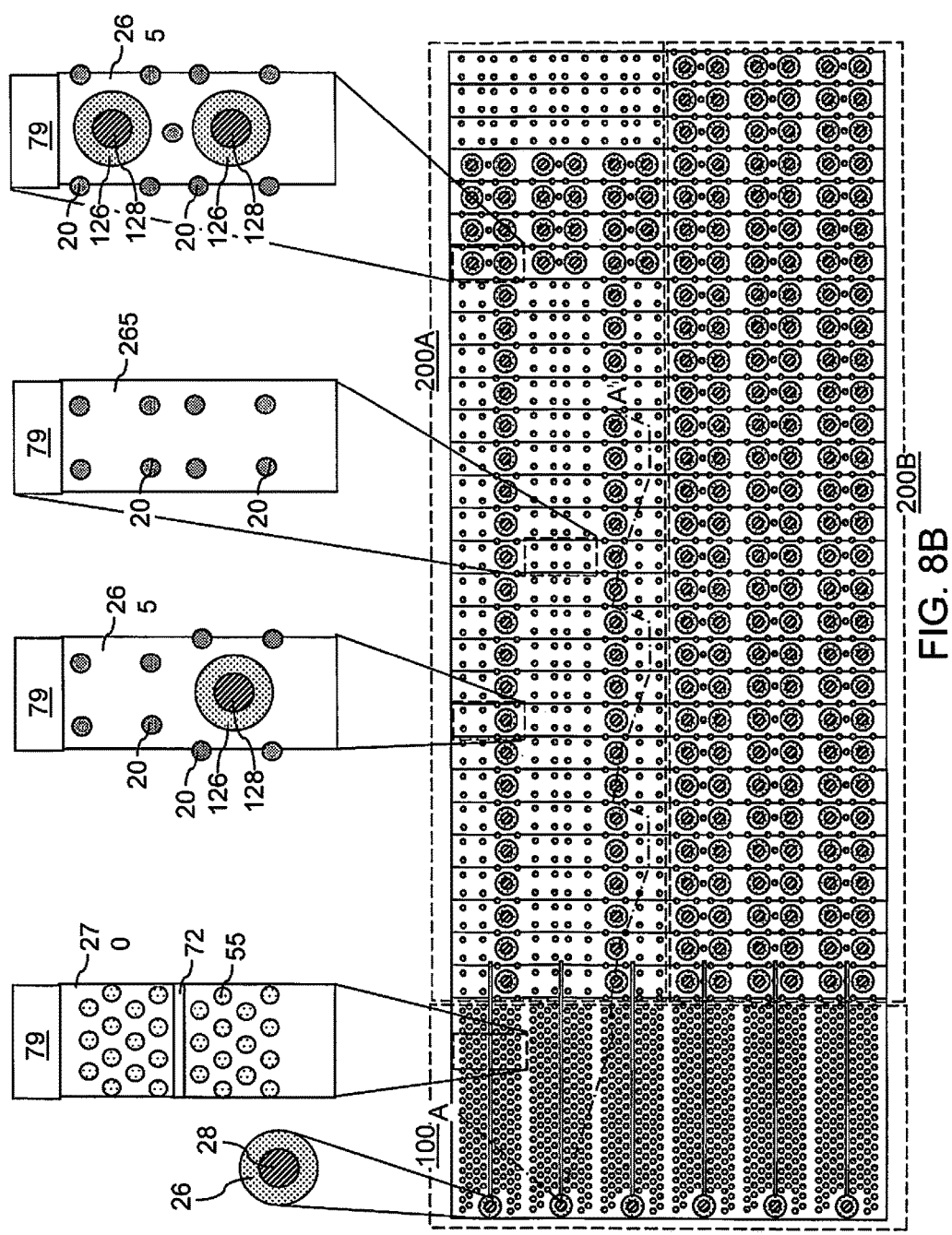
FIG. 8B is a horizontal cross-sectional view of the first exemplary structure along the horizontal plane B-B' in FIG. 8A. The zig-zag vertical plane A-A' corresponds to the plane of the vertical cross-sectional view of FIG. 8A.

Referring to FIGS. 8A and 8B, laterally-insulated conductive via structures (26, 28) and laterally-insulated support structures (126, 128) can be formed through each layer in the alternating stacks {(132, 142), (232, 242)}. The laterally-insulated conductive via structures (26, 28) are formed through the semiconductor material layer 10, the optional planar conductive material layer 6, and an upper portion of the at least one lower-interconnect-level dielectric material layer 760, and to a top surface of a respective one of a first subset of lower-interconnect-level metal interconnect structures 780 (such as top surfaces of lower level topmost metal structures 788). In one embodiment, the laterally-insulated support structures (126, 128) can be formed concurrently with the laterally-insulated conductive via structures (26, 28) and can have the same structure. In this case, the laterally-insulated support structures (126, 128) are formed through the semiconductor material layer 10, the optional planar conductive material layer 6, and an upper portion of the at least one lower-interconnect-level dielectric material layer 760, and to a top surface of a respective one of a second subset of the lower-interconnect-level metal interconnect structures 780 (such as top surfaces of dummy lower-interconnect-level metal interconnect structures 788D).

In one embodiment, the laterally-insulated conductive via structures (26, 28) and laterally-insulated support structures (126, 128) can be formed by applying and lithographically patterning a photoresist layer to form openings in the memory array regions 100 and in the word line contact via regions 200, and by performing an anisotropic etch process to form via cavities that vertically extend through the alternating stacks {(132, 142), (232, 242)}, the semiconductor material layer 10, and an upper portion of the at least one lower-interconnect-level dielectric material layer 760 to a respective top surface of the lower-interconnect-level metal interconnect structures 780. Each via cavity in the memory array regions 100 is herein referred to as a memory via cavity, and each via cavity in the word line contact via regions 200 is herein referred to as a support via cavity.

In one embodiment, a top surface of a first subset of the lower-interconnect-level metal interconnect structures 780 that are electrically connected to the semiconductor devices in the underlying peripheral device region 700 can be physically exposed at the bottom of one or more of the memory via cavities. A top surface of a second subset of the lower-interconnect-level metal interconnect structures 780 that are electrically isolated from the semiconductor devices in the underlying peripheral device region 700 can be physically exposed at the bottom of each of the support via cavities. A predominant portion, or all, of the support via cavities can vertically extend through a subset, but not all, of the layers of the alternating stacks {(132, 142), (232, 242)} and the overlying first and/or second retro-stepped dielectric material portion(s) (165, 265) in each staircase region of the alternating stacks {(132, 142), (232, 242)}. The support via cavities can vertically extend through a respective portion of each set of stepped surfaces in each staircase region. The chemistry of the anisotropic etch process can be changed during various stages of the anisotropic etch process to etch the various materials of the alternating stacks {(132, 142), (232, 242)}, the semiconductor material layer 10, and an upper portion of the at least one lower-interconnect-level dielectric material layer 760. The lower-interconnect-level metal interconnect structures 780 can be employed as etch stop structures. The photoresist layer can be subsequently removed, for example, by ashing.

A conformal dielectric material layer can be deposited in the memory via cavities and the support via cavities, for example, by low pressure chemical vapor deposition (LP-CVD) or atomic layer deposition (ALD). The conformal dielectric material layer includes a dielectric material such as silicon oxide and/or silicon nitride. The thickness of the conformal dielectric material layer can be in a range from 5 nm to 50 nm, although lesser and greater thicknesses can also be employed. Each remaining portion of the conformal dielectric material layer within a memory via cavity constitutes a first cylindrical dielectric spacer 26. Each remaining portion of the conformal dielectric material layer within a support via cavity constitutes a second cylindrical dielectric spacer 126. Thus, the first and second cylindrical dielectric spacers (26, 126) can be formed by conformal deposition and an isotropic etch of a same dielectric material. Each of the first and second cylindrical dielectric spacers (26, 126) may contact a top surface of a respective lower-interconnect-level metal interconnect structure 780.

As used herein, a "cylindrical" element refers to any element having an inner sidewall, an outer sidewall, an annular top surface, and an annular bottom surface such that a lateral distance between the inner sidewall and the outer sidewall is substantially the same. As used herein, an "annular" element refers to an element having an inner periphery and an outer periphery that does not meet the inner periphery and encircles the inner periphery. As used herein, a dimension is "substantially the same" if the variation of the dimension does not exceed 10% of the average of the dimension.

A conductive material can be deposited in each remaining volume of the memory via cavities and the support via cavities by a conformal deposition process. The conductive material can include a metallic material (such as a metal, a layer stack of at least two metals, an alloy of at least two metals, a conductive metal nitride, and/or a conductive metal carbide) or a conductive semiconductor material (such as heavily doped polysilicon). Excess portion of the conductive material can be removed from above the top surface of the second insulating cap layer 270 by a planarization process, which can include a recess etch and/or chemical mechanical planarization. Each remaining portion of the conductive material within a memory via cavity constitutes a first conductive core 28. Each remaining portion of the conductive material within a support via cavity constitutes a second conductive core 128. Thus, the first and second conductive cores (28, 128) can be formed by deposition of a same conductive material within the first and second cylindrical dielectric spacers (26, 126), respectively. Each of the first and second conductive cores (28, 128) may contact a top surface of a respective lower-interconnect-level metal interconnect structure 780.

Each first conductive core 28 is laterally surrounded by a first cylindrical dielectric spacer 26. Each adjoined pair of a first conductive core 28 and a first cylindrical dielectric spacer 26 constitutes a laterally-insulated conductive via structure (26, 28), which is located in a memory array region 100. Each second conductive core 128 is laterally surrounded by a second cylindrical dielectric spacer 126. Each adjoined pair of a second conductive core 128 and a second cylindrical dielectric spacer 126 constitutes a laterally-insulated support structure (126, 128).

In one embodiment, each of the laterally-insulated conductive via structures (26, 28) can comprise a respective first conductive core 28 that is electrically shorted to a respective one of the lower-interconnect-level metal interconnect structures 780, and a respective first cylindrical dielectric spacer 26 that laterally surrounds the respective first conductive core 28. Likewise, each of the laterally-insulated support structures (126, 128) can comprise a respective second conductive core 128 having a same composition as the first conductive core 28, and a respective second cylindrical dielectric spacer 126 that laterally surrounds the respective second conductive core 28.

If a driver circuit for the array of memory stack structures (50, 60) is formed on a top surface of the semiconductor substrate 9, a first subset of the lower-interconnect-level metal interconnect structure 780 can be electrically connected to devices of the driver circuit, and a second subset of the lower-interconnect-level metal interconnect structures 780 can be electrically isolated from any device located underneath a horizontal plane including a bottommost surface of the second subset of the lower-interconnect-level metal interconnect structures 780.

In the processing steps of FIGS. 8A and 8B, first openings (i.e., the memory via cavities) can be formed through the alternating stacks {(132, 142), (232, 242)} and the semiconductor material layer 10 to physically expose a respective top surface of the first subset of the lower-interconnect-level metal interconnect structures 780 at a bottom of each of the first openings. The laterally-insulated conductive via structures (26, 28) are formed in the first openings, and thus, in the memory array regions 100. Second openings (i.e., the support via cavities) can be formed through the alternating stacks {(132, 142), (232, 242)} and the semiconductor material layer 10 to physically expose a respective top surface of the second subset of the lower-interconnect-level metal interconnect structures 780. The laterally-insulated support structures (126, 128) can be formed in the second openings.

Figure 9A:
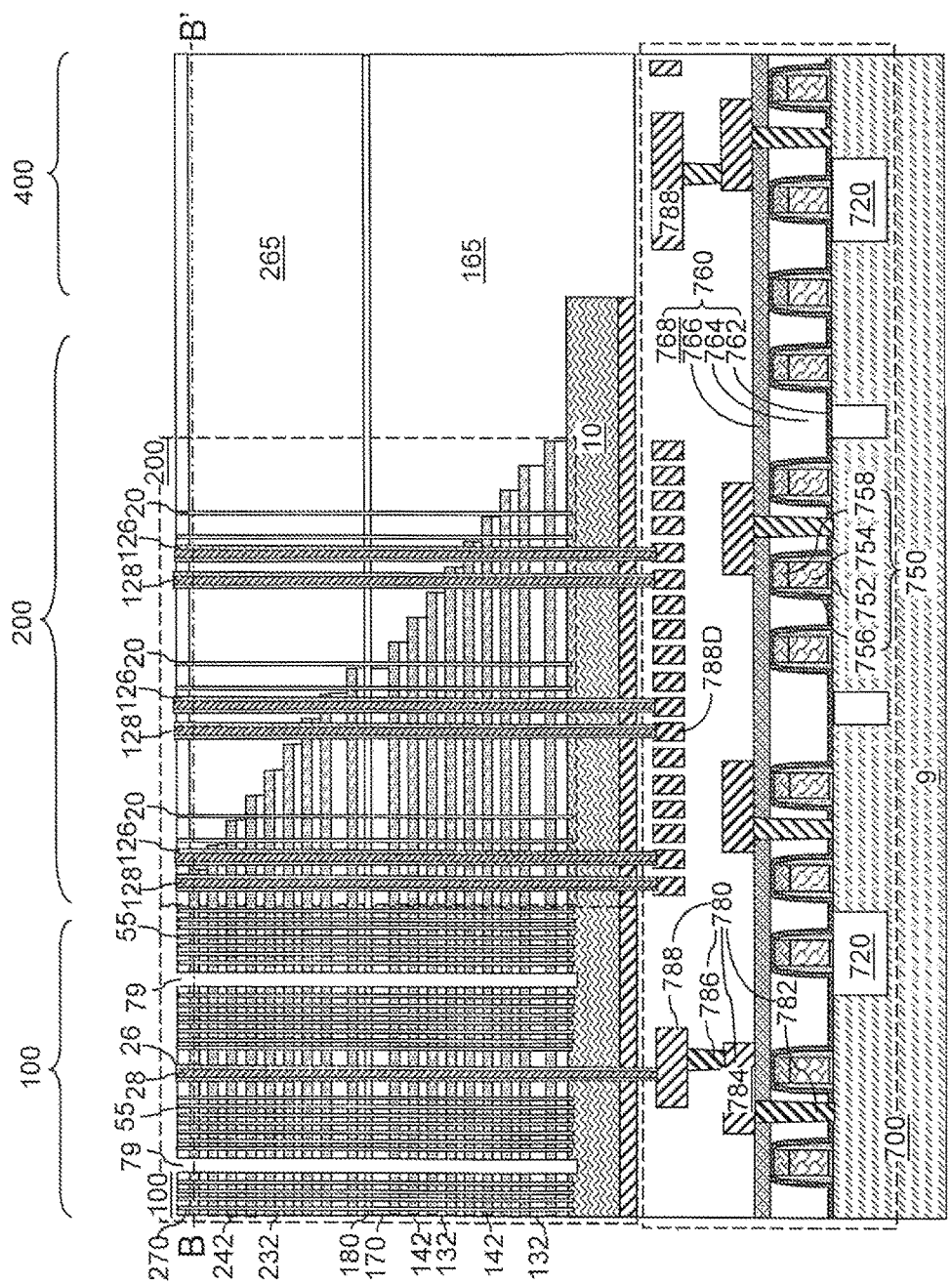
FIG. 9A is a vertical cross-sectional view of the first exemplary structure after formation of backside contact trenches according to the first embodiment of the present disclosure.
Figure 9B:
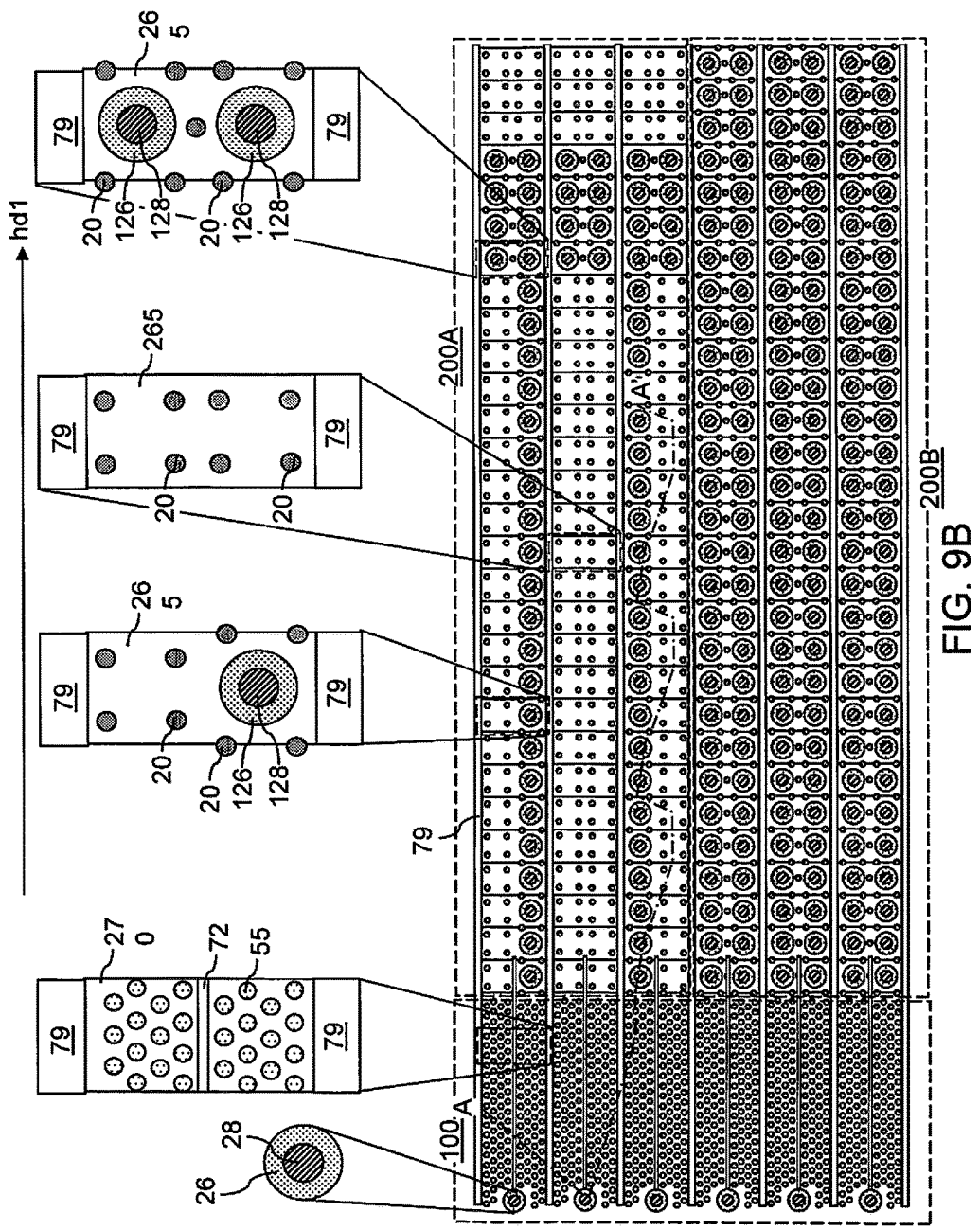
FIG. 9B is a horizontal cross-sectional view of the first exemplary structure along the horizontal plane B-B' in FIG. 9A. The zig-zag vertical plane A-A' corresponds to the plane of the vertical cross-sectional view of FIG. 9A.

Referring to FIGS. 9A and 9B, backside trenches 79 are subsequently formed through the memory-level assembly. For example, a photoresist layer can be applied an lithographically patterned over the second insulating cap layer 270 to form elongated openings that extend along the first horizontal direction hd1 that is perpendicular to vertical surfaces of each staircase region. An anisotropic etch is performed to transfer the pattern in the patterned photoresist layer through the memory-level assembly to a top surface of the semiconductor material layer 10. The photoresist layer can be subsequently removed, for example, by ashing.

The backside trenches 79 extend along the first horizontal direction hd1 (e.g., word line direction), and thus, are elongated along the first horizontal direction hd1. The backside trenches 79 can laterally extend through a respective memory array region 100 and adjoining word line contact via regions 200. The backside trenches 79 can laterally divide the memory-level assembly into multiple "fingers," each containing a plurality of memory stack structures (50, 60) and at least one laterally-insulated conductive via structures (26, 28). Further, the backside trenches 79 can laterally divide each staircase region into a set of multiple staircase regions. Each staircase region can be laterally bounded by a neighboring pair of backside trenches 79.

Each of the word line contact via region (200A, 200B) includes a plurality of staircase regions. In each staircase region, each sacrificial material layer (142, 242) except a topmost sacrificial material layer 242 laterally extends farther than any overlying sacrificial material layer (142, 242) to provide multiple sets of stepped surfaces. Each set of stepped surfaces continuously extend from a bottommost layer of the alternating stacks {(132, 142), (232, 242)} to a topmost layer of the alternating stacks {(132, 142), (232, 242)}.

In one embodiment, one or more of the staircase regions can be configured such that each horizontal surface of the stepped surfaces in each staircase region includes at least one opening through which a respective laterally-insulated support structure (126, 128) vertically extends. In one embodiment, one or more of the staircase regions can be configured such that one or more horizontal surfaces of the stepped surfaces in each staircase region include a pair of openings through which a respective pair of laterally-insulated support structures (126, 128) vertically extends. In one embodiment, one or more of the staircase regions can be configured such that one or more horizontal surfaces of the stepped surfaces in each staircase region include only a single opening through which a respective laterally-insulated support structure (126, 128) vertically extends. Each horizontal surface of each staircase region may include additional openings through which a respective semiconductor-containing support structure 20 vertically extends.

Figure 10:
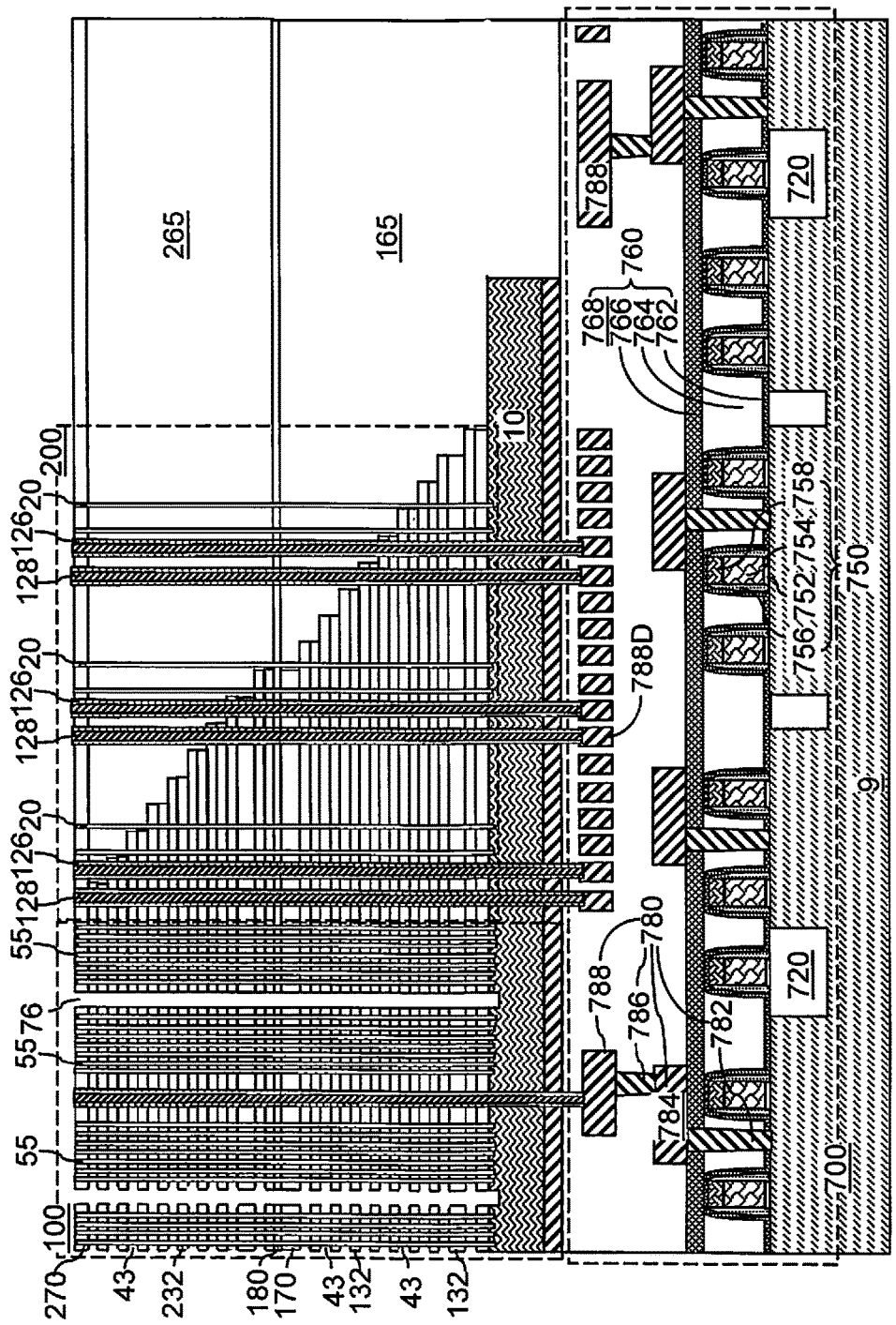
FIG. 10 is a vertical cross-sectional view of the first exemplary structure after formation of backside recesses by removal of the spacer material layers according to the first embodiment of the present disclosure.

Referring to FIG. 10, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside trenches 79, for example, employing an isotropic etch process. Backside recesses 43 are formed in volumes from which the first sacrificial material layers 142 and the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the backside recesses 43 can be a laterally extending cavity having a lateral dimension that is greater than the vertical extent of the cavity. In other words, the lateral dimension of each of the backside recesses 43 can be greater than the height of the respective backside recess 43. Each of the backside recesses 43 can extend substantially parallel to the top surface of the semiconductor material layer 10. A backside recess 43 can be vertically bounded by a top surface of an underlying insulating layer (132 or 232) and a bottom surface of an overlying insulating layer (132 or 232). In one embodiment, each of the backside recesses 43 can have a uniform height throughout.

The laterally-insulated support structures (126, 128), in addition to the memory opening fill structures 55 and the semiconductor-containing support structures 20, provide structural support to the insulating layers (132, 232) during removal of the sacrificial material layers (142, 242) which are spacer material layers.

Figure 11:
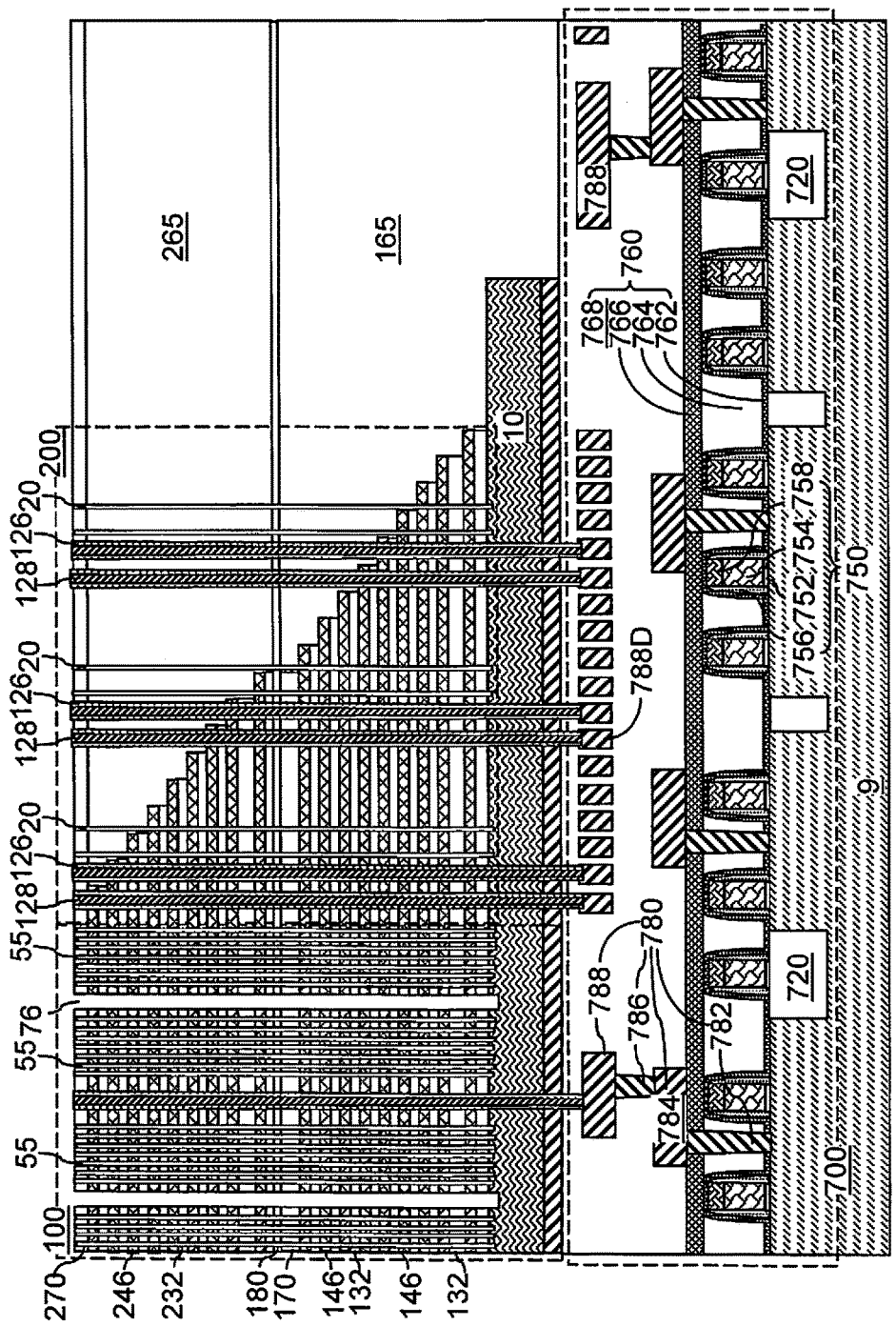
FIG. 11 is a vertical cross-sectional view of the first exemplary structure after formation of electrically conductive layers in the backside recesses according to the first embodiment of the present disclosure.

Referring to FIG. 11, a backside blocking dielectric layer (not shown) can be optionally deposited in the backside recesses 43 and the backside trenches 79 and over the second insulating cap layer 270. The backside blocking dielectric layer can be deposited on the physically exposed portions of the outer surfaces of the memory stack structures (50, 60). The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses 43, on the sidewalls of the backside trench 79, and over the second insulating cap layer 270. The at least one conductive material can include at least one metallic material, i.e., an electrically conductive material that includes at least one metallic element.

A plurality of first electrically conductive layers 146 can be formed in a first subset of the backside recesses 43 located in the first tier, i.e., located between the first insulating layers 132. A plurality of second electrically conductive layers 246 can be formed in a second subset of the backside recesses 43 located in the second tier, i.e., located between the second insulating layers 232. A continuous metallic material layer (not shown) can be formed on the sidewalls of each backside trench 79 and over the second insulating cap layer 270. Thus, the first and second sacrificial material layers (142, 242) can be replaced with the first and second conductive material layers (146, 246), respectively. Specifically, each first sacrificial material layer 142 can be replaced with a portion of the backside blocking dielectric layer and a first electrically conductive layer 146, and each second sacrificial material layer 242 can be replaced with a portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses 43 can be a combination of titanium nitride layer and a tungsten fill material. In one embodiment, the metallic material can be deposited by chemical vapor deposition or atomic layer deposition.

Residual conductive material can be removed from inside the backside trenches 79. Specifically, the deposited metallic material of the continuous metallic material layer can be etched back from the sidewalls of each backside trench 79 and from above the second insulating cap layer 270, for example, by an isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A bottom subset of the second electrically conductive layers 146 constitutes source select gate electrodes. A middle subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structures (50, 60).

Each of the memory stack structures (50, 60) comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the semiconductor substrate 9.

While the present disclosure is described employing a stack of two tier structures, embodiments are expressly contemplated herein in which only a single tier structure or more than two tier structures are employed to form memory stack structures (50, 60). The memory-level assembly includes at least one alternating stack (132, 146, 232, 246) and memory stack structures (50, 60) vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

The laterally-insulated support structures (126, 128), in addition to the memory opening fill structures 55 and the semiconductor-containing support structures 20, provide structural support to the insulating layers (132, 232) during replacement of the sacrificial material layers (142, 242) with the electrically conductive layers (146, 246).

Figure 12A:
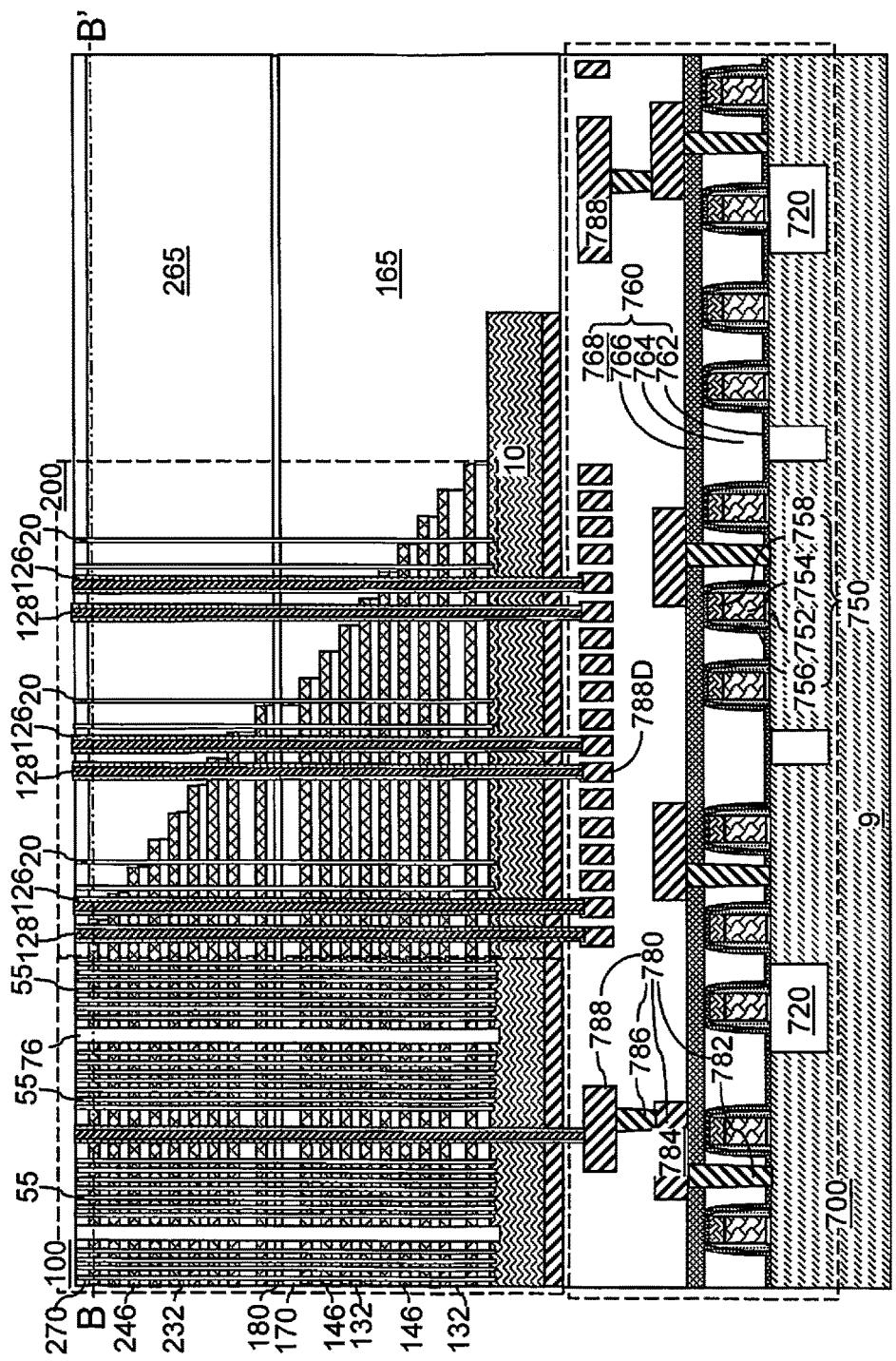
FIG. 12A is a vertical cross-sectional view of the first exemplary structure after formation of insulating wall structures according to the first embodiment of the present disclosure.
Figure 12B:
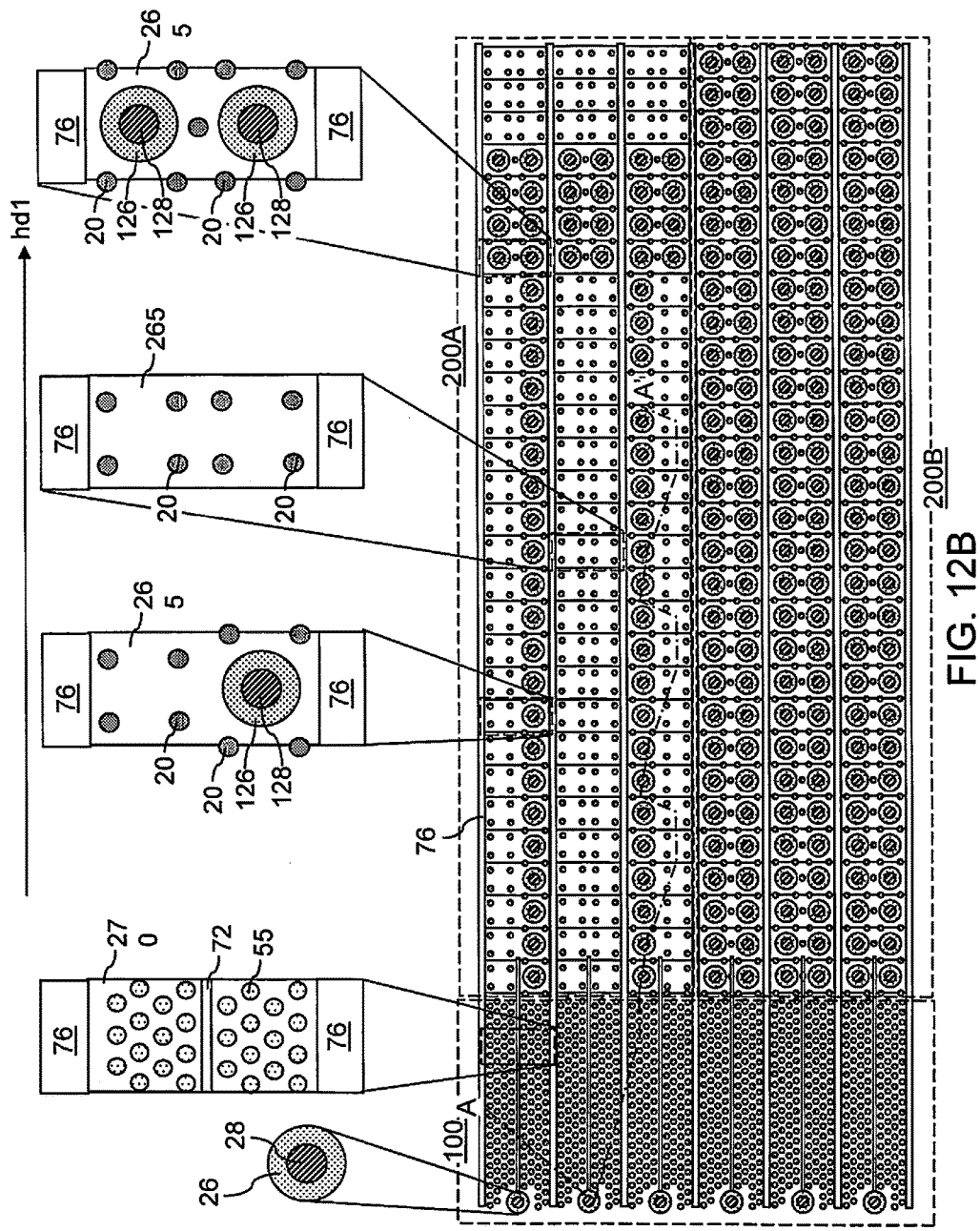
FIG. 12B is a horizontal cross-sectional view of the first exemplary structure along the horizontal plane B-B' in FIG. 12A. The zig-zag vertical plane A-A' corresponds to the plane of the vertical cross-sectional view of FIG. 12A.
Figure 13A:
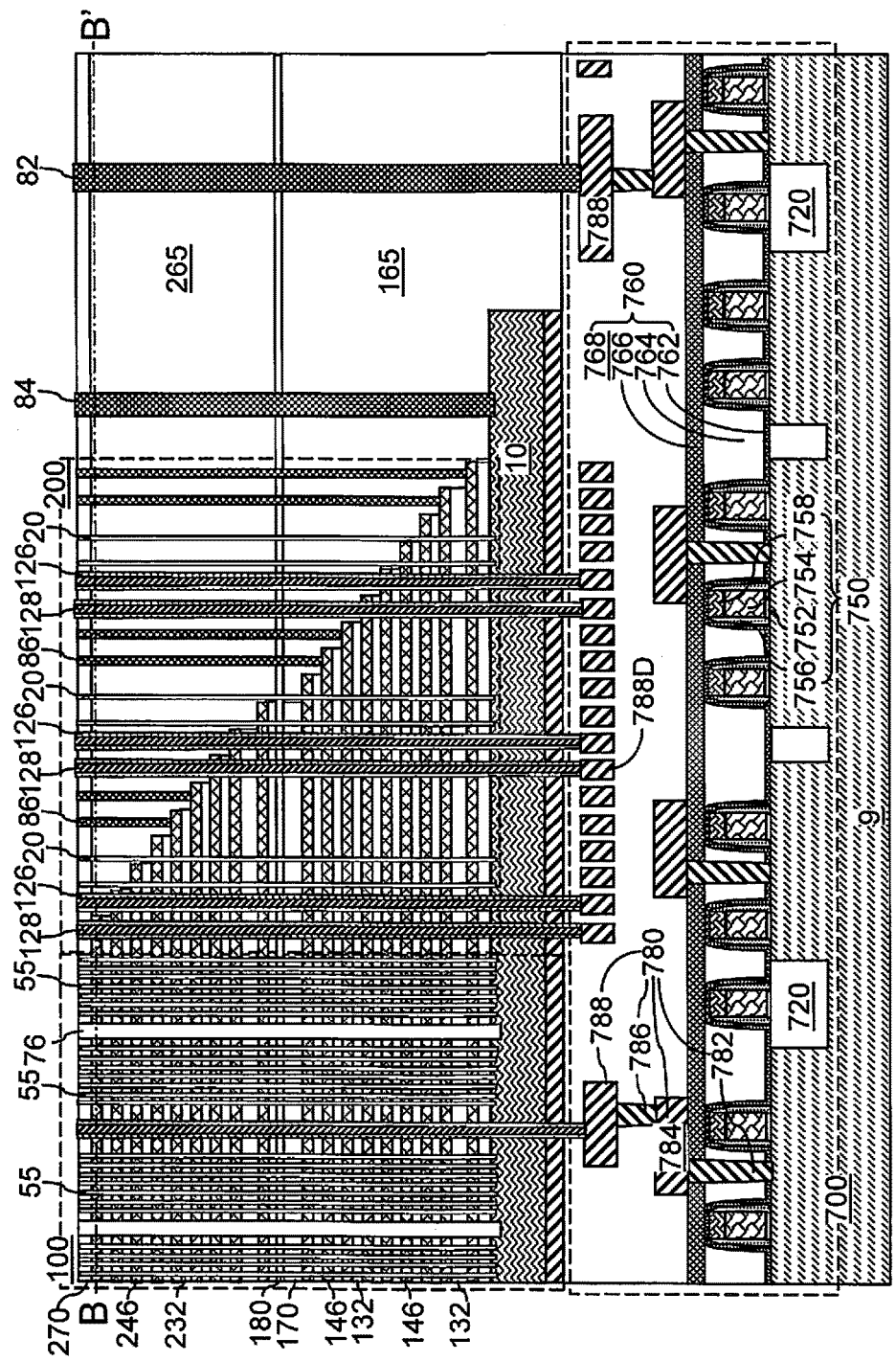
FIG. 13A is a vertical cross-sectional view of the first exemplary structure after formation of various contact via structures according to the first embodiment of the present disclosure.
Figure 13B:
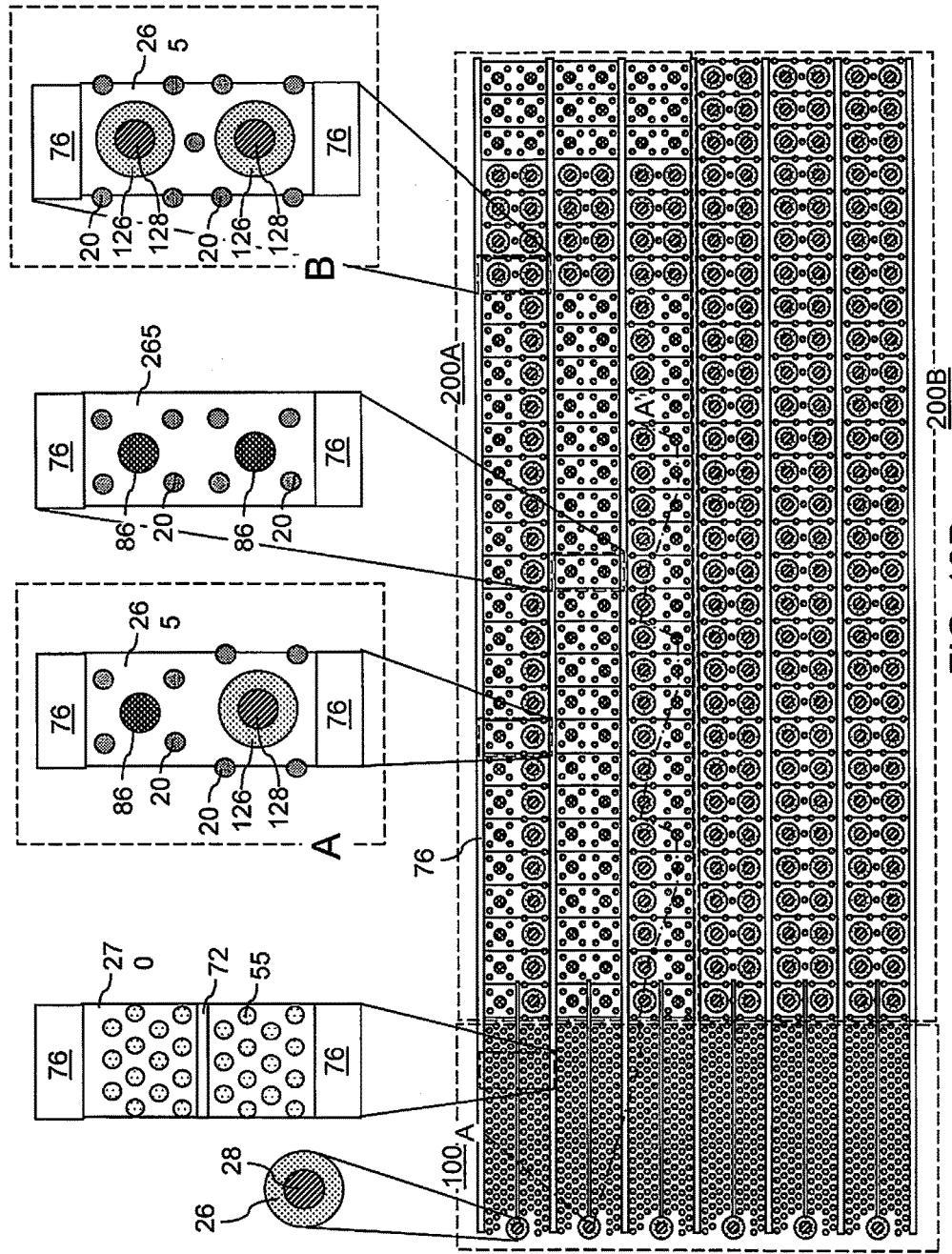
FIG. 13B is a horizontal cross-sectional view of the first exemplary structure along the horizontal plane B-B' in FIG. 13A. The zig-zag vertical plane A-A' corresponds to the plane of the vertical cross-sectional view of FIG. 13A.
Figure 13C:
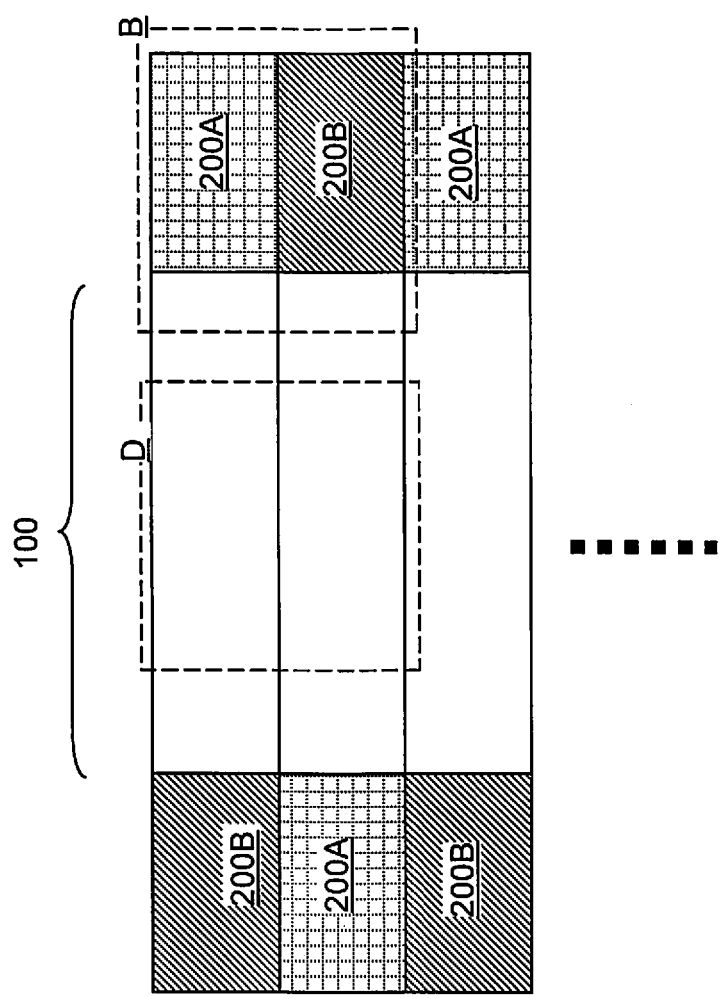
FIG. 13C is an overall plan view of the first exemplary structure of FIGS. 13A and 13B that illustrates additional regions not expressly illustrated in FIGS. 13A and 13B. Regions B and D correspond to the views of FIGS. 13B and 13D, respectively.
Figure 13D:
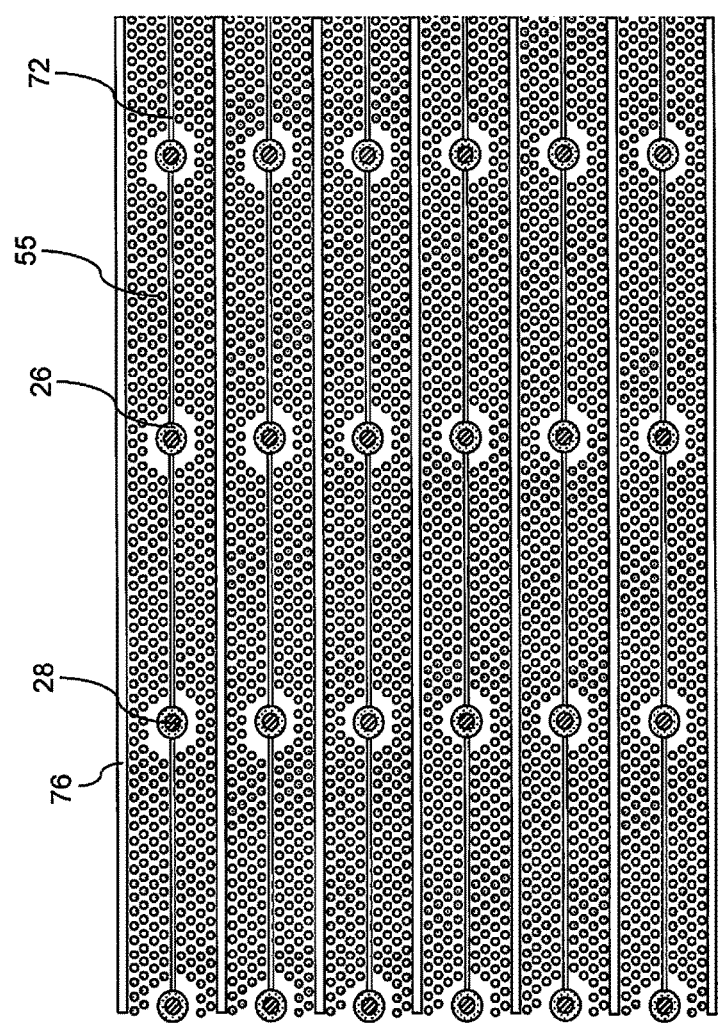
FIG. 13D is a plan view of region D of the first exemplary structure of FIG. 13C.

Referring to FIGS. 12A and 12B, in case the semiconductor material layer 10 includes buried source lines that are electrically connected to bottom portions of the vertical semiconductor channels 60, an insulating material can be deposited in the backside trenches 79 by a conformal deposition process (such as low pressure chemical vapor deposition) or by a non-conformal deposition process (such as spin coating). The horizontal portion of the deposited insulating material overlying the second insulating cap layer 270 may, or may not, be removed by a planarization process (such as a recess etch and/or chemical mechanical planarization). Each remaining portion of the deposited insulating material in the backside trenches 79 constitutes an insulating wall structure 76. Each insulating wall structure 76 laterally extends along the first horizontal direction hd1 and vertically extends through all layers within the at least one alternating sack (132, 146, 232, 246).

Alternatively, if buried source lines are not provided within the semiconductor material layer 10, a source region (not shown) can be formed by implantation of dopants of the second conductivity type (that is the opposite of the first conductivity type) by ion implantation. Surface portions of the semiconductor material layer 10 located between the source regions and the vertical semiconductor channels 60 constitute horizontal semiconductor channels. Subsequently, an insulating spacer (not shown) can be formed around the periphery of each backside trench 79 by deposition and anisotropic etch of a conformal dielectric material layer. A conductive material can be deposited in each remaining volume of the backside trenches to form a source contact via structure that contacts a respective underlying source region.

FIG. 12A is a vertical cross-sectional view of the first exemplary structure after formation of insulating wall structures according to the first embodiment of the present disclosure.

FIG. 12B is a horizontal cross-sectional view of the first exemplary structure along the horizontal plane B-B' in FIG. 12A. The zig-zag vertical plane A-A' corresponds to the plane of the vertical cross-sectional view of FIG. 12A.

Referring to FIGS. 13A-13D, various contact via structures (82, 84, 86) can be formed through the second insulating cap layer 270 and the first and second retro-stepped dielectric material portions (165, 265). Specifically, word line contact via structures 86 can be formed through the second insulating cap layer 270 and the second and/or first retro-stepped dielectric material portions (265, 165) onto a respective one of the electrically conductive layers (146, 246), which function as word lines for the memory stack structures (50, 60) within the memory opening fill structures 55. Each word line contact via structure 86 can be formed through an opening in a respective horizontal surface within the staircase regions. A semiconductor material layer contact via structure 84 (e.g., buried source line contact via structure) can be formed directly on the semiconductor material layer 10. At least one through-memory-level via structure 82 can be formed in region 400 through the second insulating cap layer 270, the first and second retro-stepped dielectric material portions (165, 265), and an upper portion of the at least one lower-contact-level dielectric material layer 760 and directly onto a subset of the lower-interconnect-level metal interconnect structures 780, which can be electrically shorted to the semiconductor devices in the underlying peripheral device region 700.

Each contact via structure (82, 84, 86) may be formed employing a respective set of patterning processes and fill processes. Alternatively, two or more types of contact via structures (82, 84, 86) may be formed employing a common set of patterning processes and fill processes provided that the anisotropic etch process therein can control vertical extent of cavities at target height levels for each type of cavities that are simultaneously formed.

Figure 14:
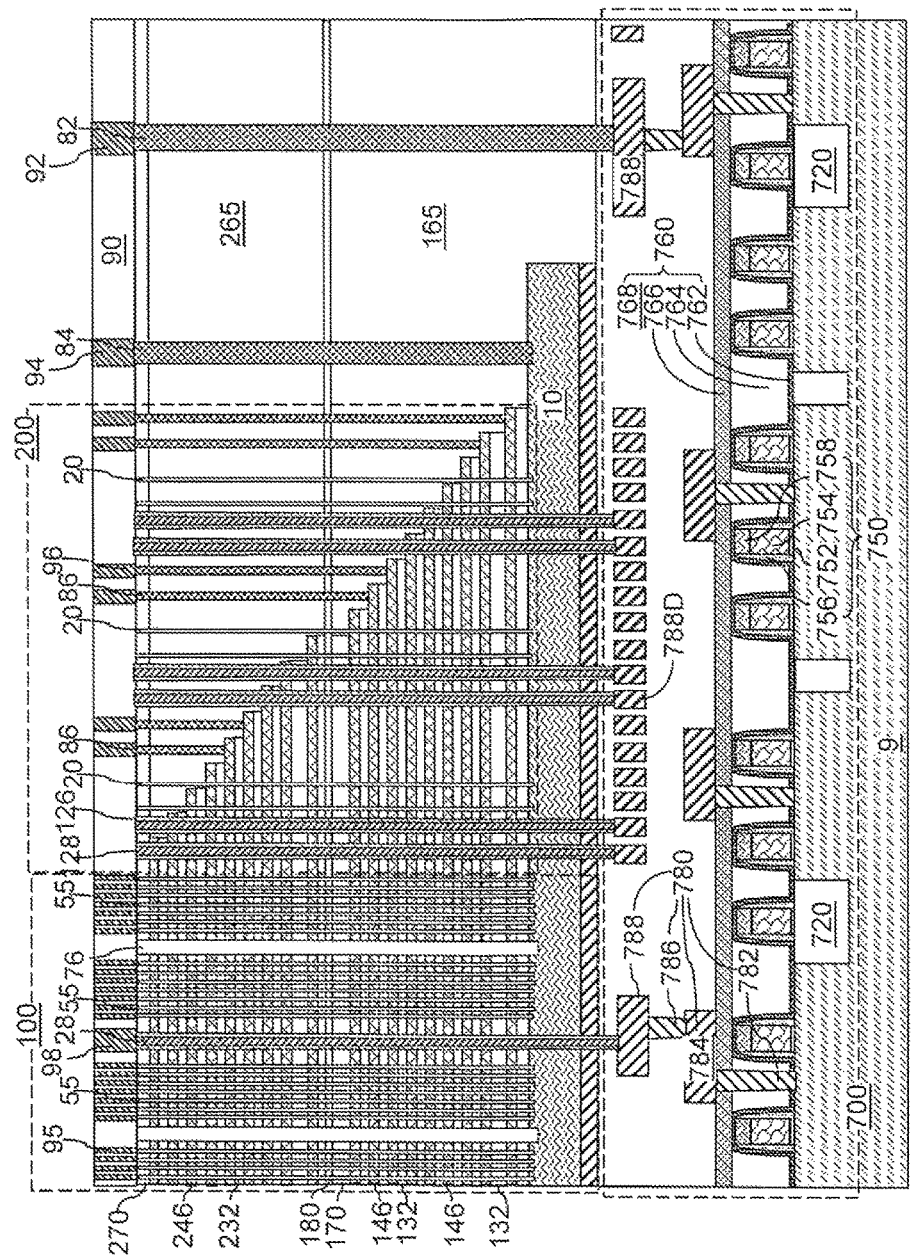
FIG. 14 is a vertical cross-sectional view of the first exemplary structure after formation of an upper-interconnect-level dielectric material layer and upper-interconnect-level metal interconnect structures according to the first embodiment of the present disclosure.

Referring to FIG. 14, at least one upper-interconnect-level dielectric material layer 90 and upper-interconnect-level metal interconnect structures (92, 94, 96, 98, 95) can be formed over the second insulating cap layer 270. The upper-interconnect-level metal interconnect structures (92, 94, 96, 98, 95) can include conductive line structures and/or conductive via structures. For example, the upper interconnect-level metal interconnect structures (92, 94, 96, 98, 95) can include drain-side connection structures 95, which can include drain contact via structures that contacts drain regions 63 of the memory opening fill structures 55 and bit lines that contact the drain side contact via structures. Further, the upper interconnect-level metal interconnect structures (92, 94, 96, 98, 95) can include word line connection structures 96, which can be electrically shorted to a respective word line contact via structure 86 and can include metal lines and optionally metal via structures. In addition, the upper interconnect-level metal interconnect structure (92, 94, 96, 98, 95) can include source-side connection structures 94 that can be electrically shorted to the semiconductor material layer contact via structure 84, and upper level interconnection structures that are electrically shorted to the through-memory-level via structure 82.

The upper interconnect-level metal interconnect structures (92, 94, 96, 98, 95) can include over-array-region metal interconnect structures 98 that can be electrically shorted to, and may physically contact, a respective one of the first conductive cores 28 of the laterally-insulated conductive via structures (26, 28). Thus, each of the first conductive cores 28 can physically contact a bottom surface of a respective one 98 of the upper-interconnect-level metal interconnect structures (92, 94, 96, 98, 95). The first conductive cores 28 can be employed as a vertical path for providing electrical power and/or signals. For example, the first conductive cores 28 may be employed as components of a power distribution network, or can be employed to provide control signals to and from the driver circuitry (e.g., signals to the various components within the memory array region 100).

Each laterally-insulated support structure (126, 128) is an electrically inactive component. The second conductive cores 128 of the laterally-insulated support structures (126, 128) are not connected to any electrically active conductive component within the at least one upper-interconnect-level dielectric material layer 90. In one embodiment, the entirety of the top planar surface of each second conductive core 128 can contact a respective bottom surface of an overlying upper-interconnect-level dielectric material layer 90 after formation of the upper-interconnect-level metal interconnect structures (92, 94, 96, 98, 95). Likewise, each semiconductor-containing support structure 20 is an electrically inactive component. Thus, the drain regions 63 of the semiconductor-containing support structures 20 are not connected to any electrically active conductive component within the at least one upper-interconnect-level dielectric material layer 90. In one embodiment, the entirety of the top planar surface of each drain region 63 of the semiconductor-containing support structures 20 can contact a respective bottom surface of an overlying upper-interconnect-level dielectric material layer 90 after formation of the upper-interconnect-level metal interconnect structures (92, 94, 96, 98, 95). As used herein, an element is "electrically inactive" if the element is not capable of altering the state of any other device.

Figure 15:
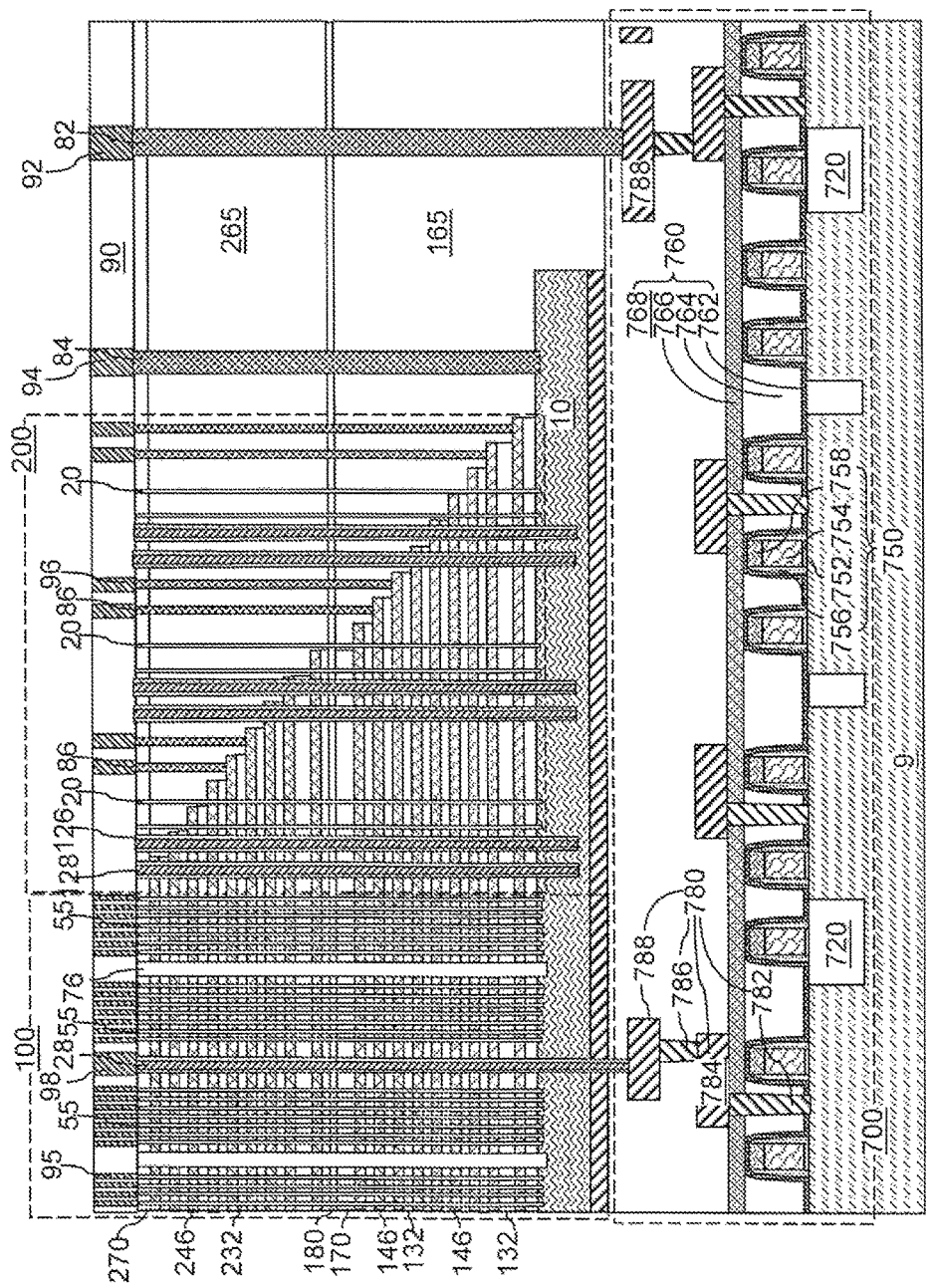
FIG. 15 is a vertical cross-sectional view of a first alternate embodiment of the first exemplary structure according to the first embodiment of the present disclosure.

Referring to FIG. 15, a first alternate embodiment of the first exemplary structure according to the first embodiment of the present disclosure is illustrated. The first alternate embodiment of the first exemplary structure can be derived from the first exemplary structure by modifying the structures of the laterally-insulated support structures (126, 128). Specifically, the memory via cavities and the support via cavities can be formed only into the semiconductor material layer 10 without etching through the semiconductor material layer 10 at the processing steps of FIGS. 8A and 8B. The anisotropic etch is terminated while surfaces of the semiconductor material layer 10 are physically exposed at the bottom of the each of the memory via cavities and the support via cavities.

A photoresist layer can be applied over the first exemplary structure, and can be lithographically patterned to cover the word line contact via regions 200 and do not cover the memory array regions 100. Another anisotropic etch process is performed to extend the depth of each memory via cavity into an upper portion of the at least one lower-interconnect-level dielectric material layer 760 and to physically expose top surfaces of the first subset of the lower-interconnect-level metal interconnect structures 780 at the bottom of the memory via cavities. Subsequently, the photoresist layer can be removed, for example, by ashing. Subsequently, the remaining processing steps of FIGS. 8A and 8B can be performed to form laterally-insulated conductive via structures (26, 28) in the memory via cavities and to form the laterally-insulated support structures (126, 128) in the support via cavities.

In this case, first openings (i.e., the memory via cavities) can be formed through each alternating stack {(132, 142), (232, 242)} and the semiconductor material layer 10 to physically expose a respective top surface of the lower-interconnect-level metal interconnect structures 780 at a bottom of each of the first openings. Second openings (i.e., the support via openings) can be formed through each alternating stack {(132, 142), (232, 242)} to physically expose a recessed surface of the semiconductor material layer 10. The laterally-insulated conductive via structures (26, 28) are formed in the first openings. The laterally-insulated support structures (126, 128) are formed in the second openings and directly on the vertically recessed surfaces of the semiconductor material layer 10, which are the bottom surfaces of the support via openings.

In each of the first exemplary structure and the first alternate embodiment thereof, various layouts can be employed for the laterally-insulated support structures (126, 128), the word line contact via structures 86, and the semiconductor-containing support structures 20 in the staircase regions in the word line contact via regions 200, which include first-type word line contact via regions 200A and second-type word line contact via regions 200B. Alternatively, some laterally-insulated support structures (126, 128) can contact the semiconductor material layer (e.g., buried source line) while others can contact metal interconnect structures 780. In other words, each row extending in the first horizontal direction (e.g., word line direction hd1) can have alternating laterally-insulated conductive via structures (26, 28) and laterally-insulated support structures (126, 128) instead of each row containing only one type of these structures.

Figure 16:
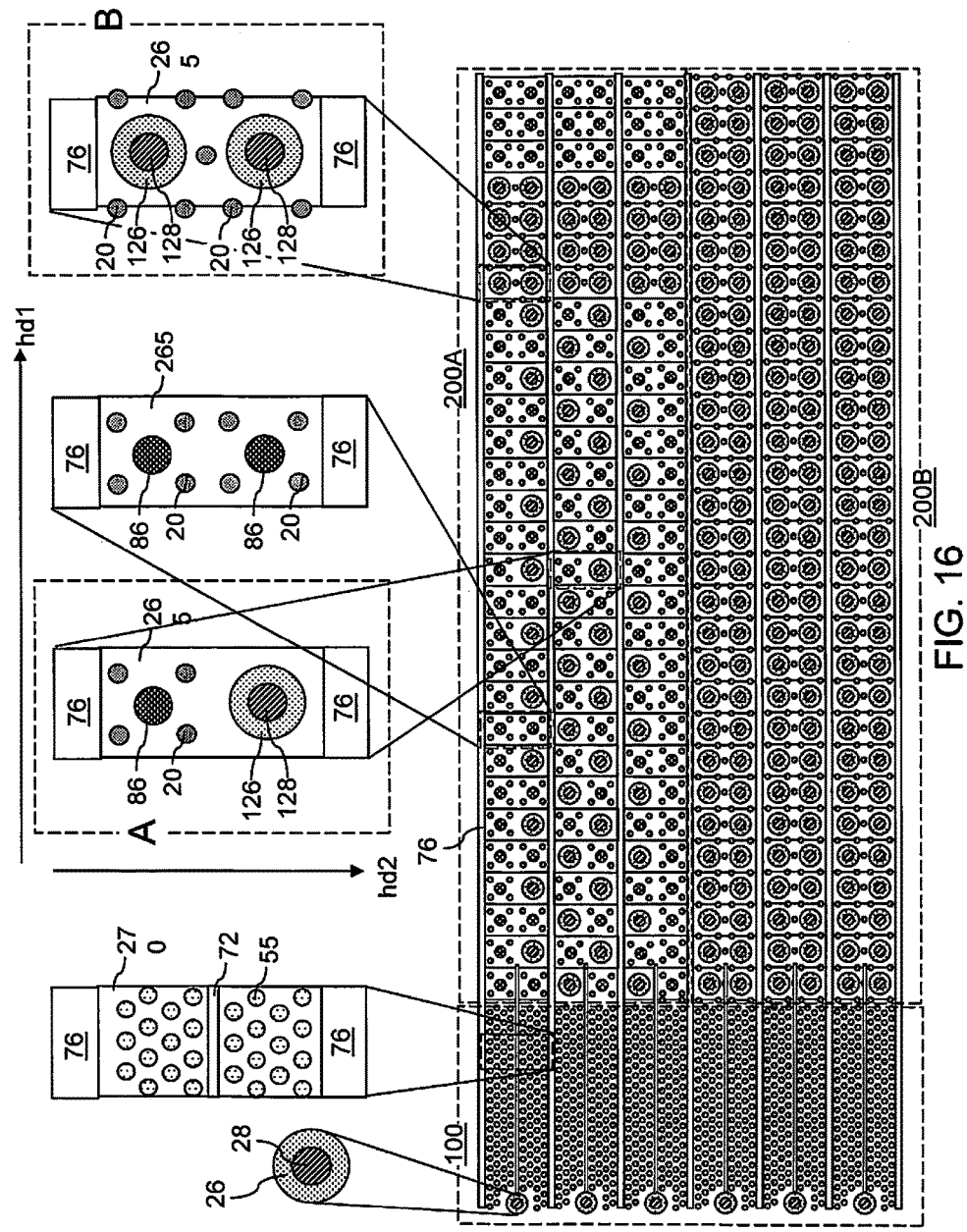
FIG. 16 is a horizontal cross-sectional view of a second alternate embodiment of the first exemplary structure according to the first embodiment of the present disclosure.

Referring to FIG. 16, a horizontal cross-sectional view of a first alternate embodiment of the first exemplary structure according to the first embodiment of the present disclosure is illustrated, which shows an alternative layout of the laterally-insulated support structures (126, 128), the word line contact via structures 86, and the semiconductor-containing support structures 20 in the staircase regions in a word line contact via regions 200. Specifically, horizontal surfaces of a staircase region can include a pair of openings for a laterally-insulated support structure (126, 128) and an opening for a word line contact via structure 86 that contacts an underlying electrically conductive layer (146, 246) per horizontal surface. Within a staircase region (such as the second-from-the-top staircase region of FIG. 16), lateral displacement of openings along a second horizontal direction hd2 (e.g., bit line direction which is perpendicular to the first (i.e., word line) direction hd1) for the laterally-insulated support structures (126, 128) can alternate along the first horizontal direction hd1. In addition, lateral displacement of openings along the second horizontal direction hd2 for the word line contact via structures 86 can alternate in an opposite pattern along the first horizontal direction hd1. Thus, two different patterns for pairs of opening for a laterally-insulated support structure (126, 128) and an opening for a word line contact via structure 86 can alternate along the first horizontal direction hd1. Such patterns can more uniformly distribute the laterally-insulated support structures (126, 128) to improve structural integrity of the first exemplary structure while backside recesses 43 are present within the first exemplary structure. Specifically, each finger can be provided with balanced structural support by staggering the pattern of the laterally-insulated support structures (126, 128) that are arranged generally along the first horizontal direction hd1.

Figure 17A:
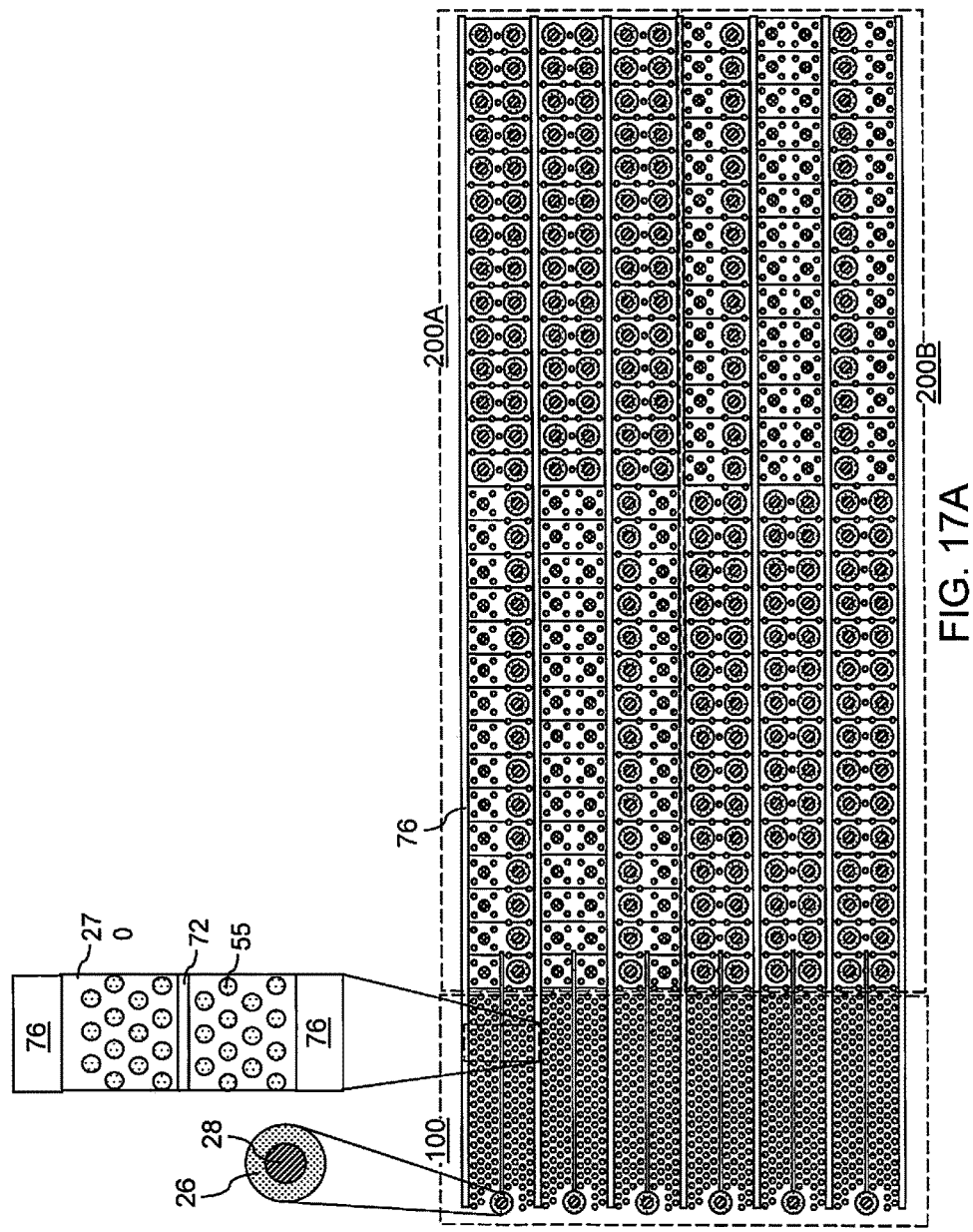
FIG. 17A is a horizontal cross-sectional view of a first region of a third alternate embodiment of the first exemplary structure according to the first embodiment of the present disclosure.
Figure 17B:
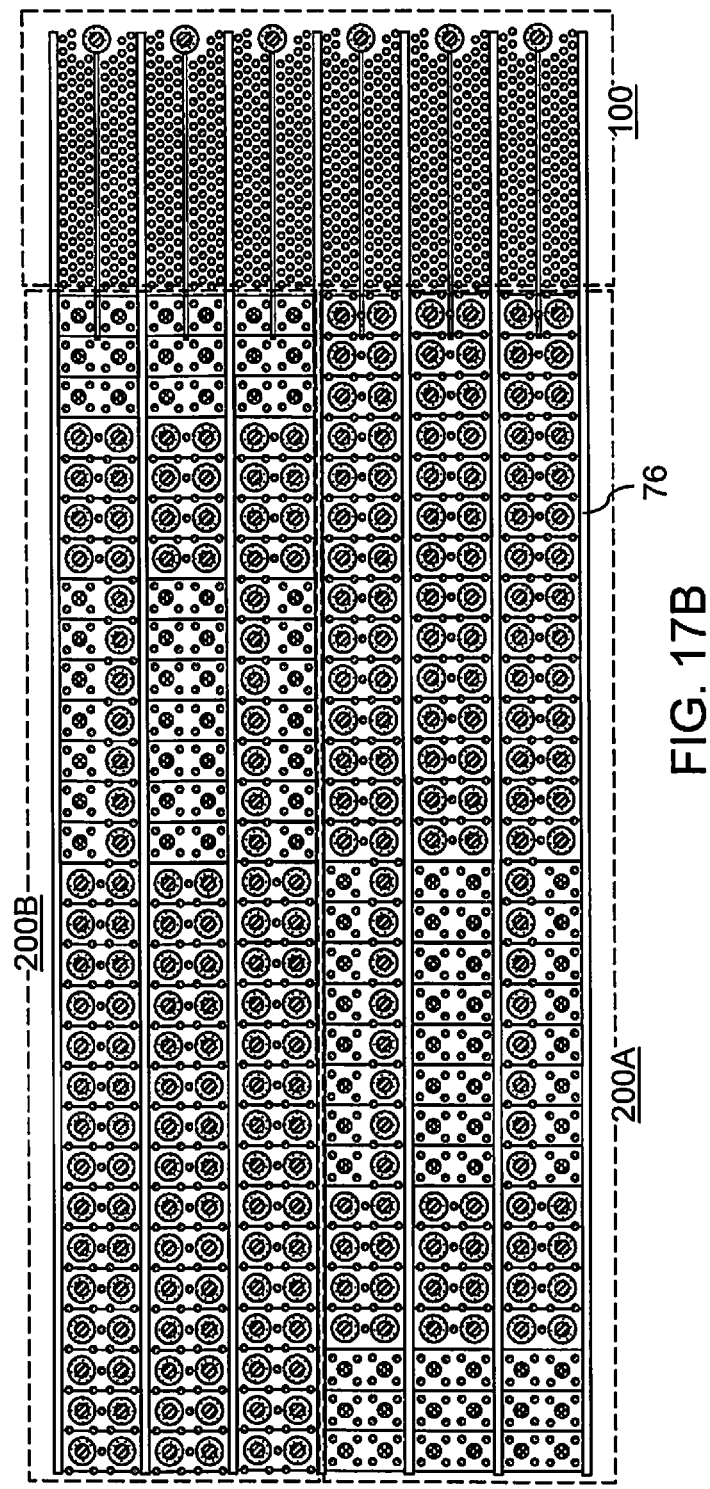
FIG. 17B is a horizontal cross-sectional view of a second region of a third alternate embodiment of the first exemplary structure according to the first embodiment of the present disclosure.

Referring to FIGS. 17A and 17B, a first region and a second region of a second alternate embodiment of the first exemplary structure according to the first embodiment of the present disclosure are illustrated, respectively. In this case, the laterally-insulated support structures (126, 128) can be distributed in substantially equal numbers for each finger (i.e., each portion of the alternating stacks that are laterally bounded by a pair of neighboring backside trenches 79 and all structures embedded within the portion of the alternating stacks) of the first exemplary structure to provide more uniform structural support. In addition, each finger within the first-type contact via region 200A and the second-type contact via region 200B can be employed to provide word line contact via structures 86, thereby distributing the laterally-insulated support structures (126, 128) more uniformly. In one embodiment, the first-type contact via region 200A and the second-type contact via region 200B can have a two-fold rotational symmetry around a vertical axis, i.e., of a same design except for a rotation by 180 degrees around a vertical direction.

The first exemplary structure and the various alternate embodiments thereof can include a three-dimensional memory device. The three-dimensional memory device can comprise: a lower-interconnect-level dielectric material layer 760 located over a semiconductor substrate 9 and embedding lower-interconnect-level metal interconnect structures 780; a semiconductor material layer 10 overlying the lower-interconnect-level dielectric material layer 760; an alternating stack {(132, 146) and/or (232, 246)} of insulating layers (132 and/or 232) and electrically conductive layers (146 and/or 246) located over the semiconductor material layer 10; an array of memory stack structures (50, 60) extending through the alternating stack {(132, 146) and/or (232, 246)}; laterally-insulated conductive via structures (26, 28) that vertically extend through each layer in the alternating stack {(132, 146) and/or (232, 246)} and through the semiconductor material layer 10, wherein each of the laterally-insulated conductive via structures (26, 28) comprises a respective first conductive core 28 that is electrically shorted to a respective one of the lower-interconnect-level metal interconnect structures 780, and a respective first cylindrical dielectric spacer 26 that laterally surrounds the respective first conductive core 28; and laterally-insulated support structures (126, 128) that vertically extend through a subset of layers in the alternating stack {(132, 146) and/or (232, 246)}, wherein each of the laterally-insulated support structures (126, 128) comprises a respective second conductive core 128 having a same composition as the first conductive core 28, and a respective second cylindrical dielectric spacer 126 that laterally surrounds the respective second conductive core 128, and wherein an entirety of a top planar surface of each second conductive core 128 contacts a respective bottom surface of an overlying upper-interconnect-level dielectric material layer 90.

In one embodiment, each first conductive core 28 contacts a bottom surface of a respective one 98 of upper-interconnect-level metal interconnect structures (92, 94, 95, 96, 98) that are embedded within the overlying upper-interconnect-level dielectric material layer 90. In some embodiments, such as the first alternate embodiment or the second and third alternate embodiments based on the first alternate embodiment, a bottommost surface of each second conductive core 128 can be located between a first horizontal plane including a bottommost surface of the semiconductor material layer 10 and a second horizontal plane including a topmost surface of the semiconductor material layer 10.

In one embodiment, a bottommost surface of each second conductive core 128 contacts a respective metallic material portion (such as dummy lower-interconnect-level metal interconnect structures 788D) embedded within the lower-interconnect-level dielectric material layer, and each second conductive core 128 is electrically isolated from any conductive or semiconducting material within the semiconductor substrate 9, the semiconductor material layer 10, the alternating stack {(132, 146) and/or (232, 246)}, or upper-interconnect-level metal interconnect structures (92, 94, 95, 96, 98) located over the alternating stack {(132, 146) and/or (232, 246)}.

In one embodiment, the alternating stack {(132, 146) and/or (232, 246)} includes a staircase region in which each electrically conductive layer (146, 246) except a topmost electrically conductive layer 246 laterally extends farther than any overlying electrically conductive layer (146, 246) to provide multiple sets of stepped surfaces, wherein each set of stepped surfaces continuously extend from a bottommost layer of the alternating stack {(132, 146) and/or (232, 246)} to a topmost layer of the alternating stack {(132, 146) and/or (232, 246)}. A retro-stepped dielectric material portion 265 overlies the multiple sets of stepped surfaces. The laterally-insulated support structures (126, 128) vertically extend through a respective portion of the multiple sets of stepped surfaces and the retro-stepped dielectric material portion 265.

The three-dimensional memory device can further comprise contact via structures 86 vertically extending from a top surface of the retro-stepped dielectric material portion 265 to a respective region of the multiple sets of stepped surfaces and contacting a respective one of the electrically conductive layers (146, 246). A subset of horizontal surfaces within one set among the multiple sets of stepped surfaces includes a respective horizontal surface including a first opening through which a respective one of the contact via structures 86 extends vertically and a second opening through which a respective one of the laterally-insulated support structures (126, 128) extends vertically (as illustrated in insets A in FIGS. 13B and 16).

The three-dimensional memory device can further comprise backside trenches 79 laterally extending along a horizontal direction hd1 and vertically extending through an entirety of the alternating stack {(132, 146) and/or (232, 246)}. Each set of stepped surfaces is laterally bounded by a neighboring pair of the backside trenches 79. In one embodiment, a complementary subset of horizontal surfaces within the one set among the multiple sets of stepped surfaces includes openings through which a respective one of the laterally-insulated support structures (126, 128) extend vertically, and does not contact any of the contact via structures 86 (as illustrated in insets B in FIGS. 13B and 16). In one embodiment, the complementary subset of horizontal surfaces and the set of horizontal surfaces collectively comprise all horizontal surfaces of the one set among the multiple sets of stepped surfaces (as illustrated in the topmost and the third-from-the-top finger in FIG. 13B and in the second-from-the-top finger in FIG. 16).

In one embodiment, the three-dimensional memory device can further comprise semiconductor-containing support structures 20 extending through the multiple sets of stepped surfaces. Each semiconductor-containing support structure 20 and each memory stack structure (50, 60) comprises a respective instance of a memory film 50 and a respective instance of a vertical semiconductor channel 60 that is laterally surrounded by the respective instance of the memory film 50 and contacts a bottom surface of a respective instance of a drain region 63. Each horizontal surface within the multiple sets of stepped surfaces includes at least one opening through which a respective one of the semiconductor-containing support structures 20 extends vertically.

In one embodiment, each memory stack structure (50, 60) within the array includes a vertical semiconductor channel 60 electrically connected to the semiconductor material layer 10, and a driver circuit for the array of memory stack structures (50, 60) is located on a top surface of the semiconductor substrate 9, and is electrically connected to at least one of the electrically conductive layers (146, 246) in the alternating stack {(132, 146) and/or (232, 246)} and drain regions 63 overlying vertical semiconductor channels 60 within the memory stack structures (50, 60) through a subset of the lower-interconnect-level metal interconnect structures 780. In other words, the driver circuit can be electrically connected to the word lines and/or the bit lines of the array of memory stack structures (50, 60).

In one embodiment, the three-dimensional memory device can comprise a monolithic three-dimensional NAND memory device; the electrically conductive layers (146, 246) can comprise, or can be electrically connected to, a respective word line of the monolithic three-dimensional NAND memory device; the semiconductor substrate 9 can comprise a silicon substrate; the monolithic three-dimensional NAND memory device comprises an array of monolithic three-dimensional NAND strings over the silicon substrate; and at least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon; the electrically conductive layers (146, 246) can comprise a plurality of control gate electrodes having a strip shape extending substantially parallel to the top surface of the semiconductor substrate 10; and the plurality of control gate electrodes comprise at least a first control gate electrode located in the first device level and a second control gate electrode located in the second device level. The array of monolithic three-dimensional NAND strings can comprise: a plurality of semiconductor channels (the vertical semiconductor channels 60 and optionally horizontal semiconductor channels that are surface portions of the semiconductor material layer 10), wherein at least one end portion of each of the plurality of semiconductor channels extends substantially perpendicular to a top surface of the semiconductor substrate 9, and a plurality of charge storage elements (as embodied as portions of the memory material layer 54 located at levels of the electrically conductive layers (146, 246), each charge storage element located adjacent to a respective one of the plurality of semiconductor channels.

According to another aspect of the present disclosure, additional semiconductor-containing support structures 20 can be formed in lieu of laterally-insulated support structures (126, 128) of the first exemplary structure. In this case, an instance of an M×N array of semiconductor-containing support structures 20 can replace each instance of a laterally-insulated support structure (126, 128) illustrated in FIGS. 13A-13D, FIG. 14, or FIG. 15. M is an integer greater than 2 (such as 3, 4, 5, 6, etc.), and N is an integer greater than 1 (such as 2, 3, 4, 5, 6, etc.)

Figure 18:
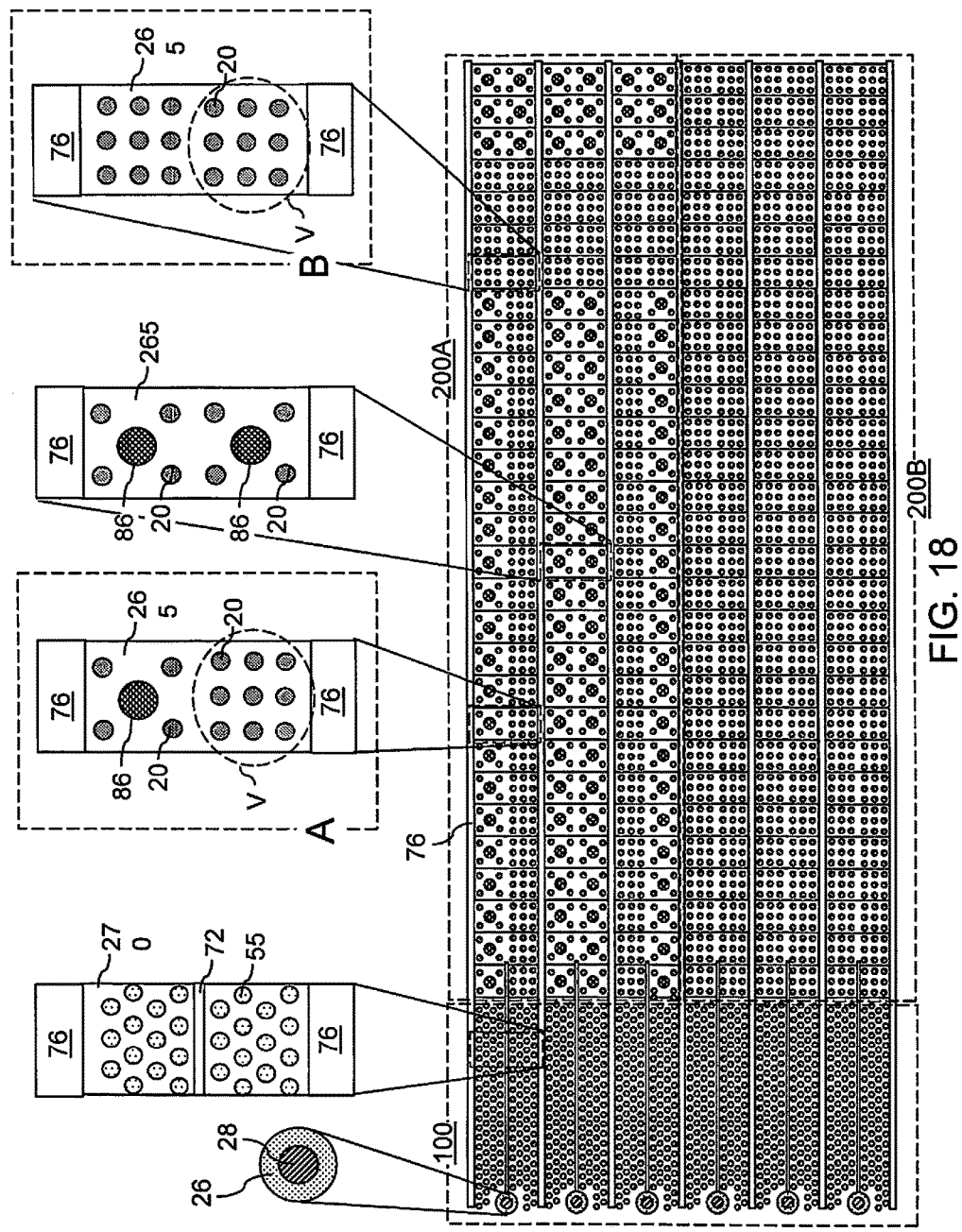
FIG. 18 is a horizontal cross-sectional view of a second exemplary structure according to a second embodiment of the present disclosure.

FIG. 18 illustrates a layout of a second exemplary structure according to a second embodiment of the present disclosure, which is derived from the first exemplary structure of FIG. 14 or FIG. 15 by replacing each instance of a laterally-insulated support structure (126, 128) with an instance of an M×N array of semiconductor-containing support structures 20.

Figure 19:
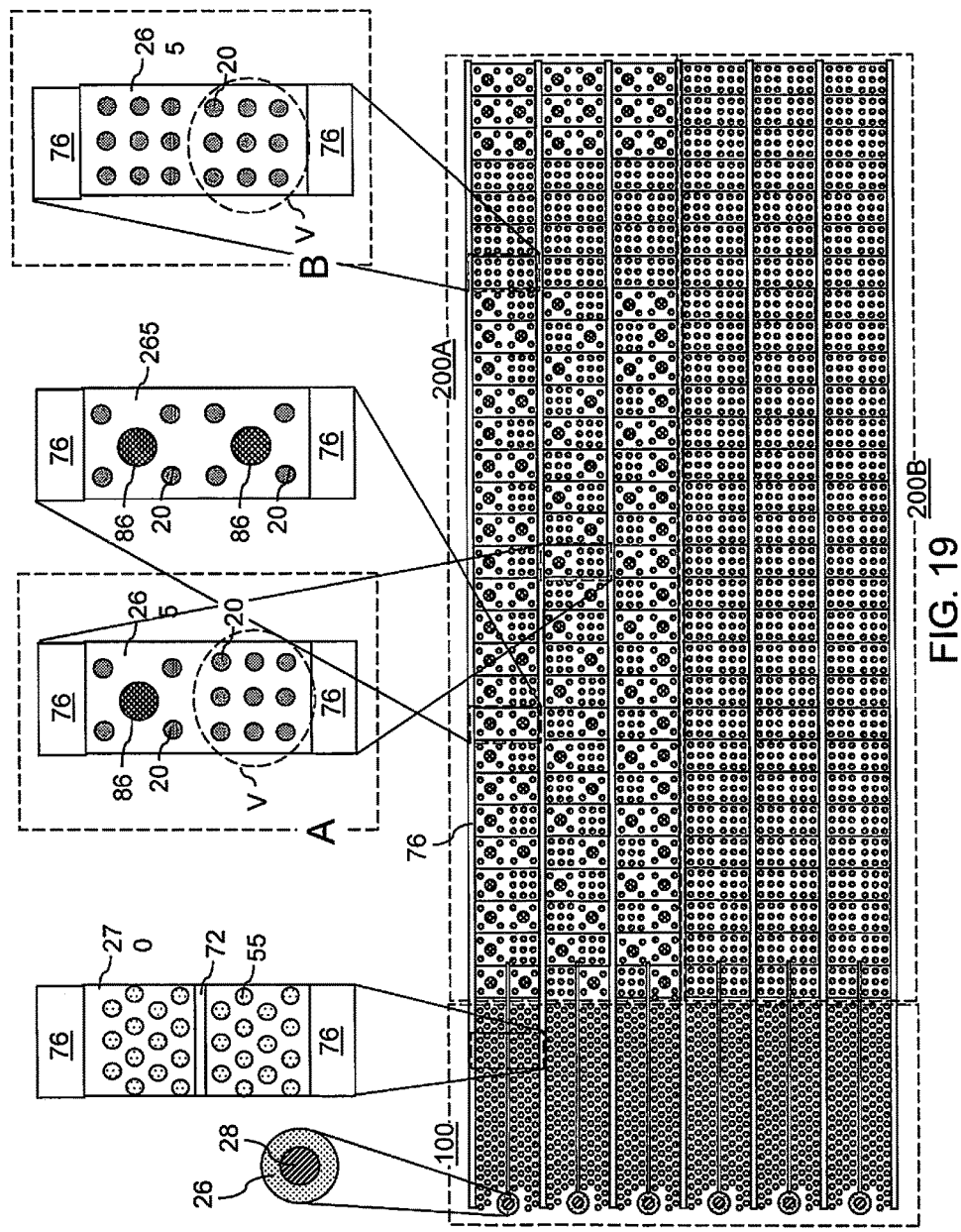
FIG. 19 is a horizontal cross-sectional view of a first alternate embodiment of the second exemplary structure according to a second embodiment of the present disclosure.

FIG. 19 illustrates a layout of a first alternate embodiment of the second exemplary structure according to a second embodiment of the present disclosure, which is derived from the second alternate embodiment of the first exemplary structure of FIG. 16 by replacing each instance of a laterally-insulated support structure (126, 128) with an instance of an M×N array of semiconductor-containing support structures 20.

Figure 20A:
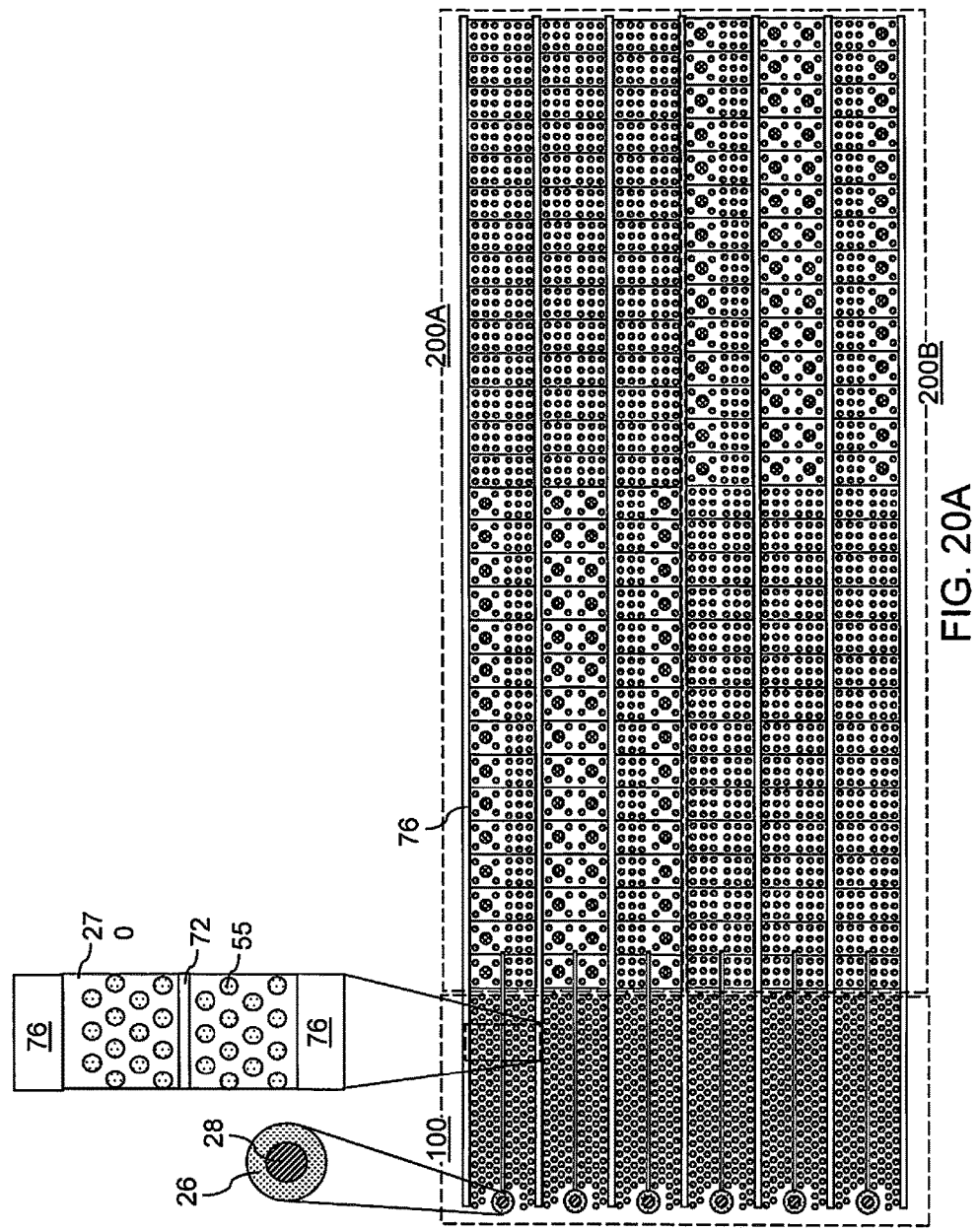
FIG. 20A is a horizontal cross-sectional view of a first region of a second alternate embodiment of the second exemplary structure according to the second embodiment of the present disclosure.

FIGS. 20A and 20B illustrate a layout of a second alternate embodiment of the second exemplary structure according to the second embodiment of the present disclosure, which is derived from the third alternate embodiment of the first exemplary structure of FIGS. 17A and 17B by replacing each instance of a laterally-insulated support structure (126, 128) with an instance of an M×N array of semiconductor-containing support structures 20.

In each of the second exemplary structure and the alternate embodiments thereof, the M×N arrays of semiconductor-containing support structures 20 can provide structural support to the second exemplary structure during replacement of the first and second sacrificial material layers (142, 242) with first and second electrically conductive layers (146, 246), i.e., while the backside recesses 43 are present between vertically neighboring pairs of insulating layers (132, 232).

In addition, interstitial semiconductor-containing support structures (not expressly shown) can be formed within each M×N array of semiconductor-containing support structures 20. For example, if M is 3 and N is 2, a pair of semiconductor-containing support structures 20 can be inserted between the two rows of three semiconductor-containing support structures 20 at interstitial positions. Generally speaking, additional semiconductor-containing support structures 20 may be formed within each instance of an M×N array of semiconductor-containing support structures 20 to provide additional structural support during replacement of the first and second sacrificial material layers (142, 242) with first and second electrically conductive layers (146, 246).

Each of the second exemplary structure and the alternate embodiments thereof can include a three-dimensional memory device, which can be a derivative structure of the second exemplary structure or alternate embodiments thereof, and thus, includes all features of the corresponding first exemplary structure except features relating to the additional semiconductor-containing support structures 20 and the laterally-insulated support structures (126, 128).

In addition, hybrid structures can be derived from the first and second exemplary structures by not replacing a first subset of the laterally-insulated support structures (126, 128) in the first exemplary structure and by replacing a second subset of the laterally-insulated support structures (126, 128) with respective M×N arrays of semiconductor-containing support structures 20.

The three-dimensional memory device is in the second exemplary structure or the alternate embodiments thereof can comprise: a lower-interconnect-level dielectric material layer 760 located over a semiconductor substrate 9 and embedding lower-interconnect-level metal interconnect structures 780; a semiconductor material layer 10 overlying the lower-interconnect-level dielectric material layer 760; {(132, 146) and/or (232, 246)} of insulating layers (132 and/or 232) and electrically conductive layers (146 and/or 246) located over the semiconductor material layer 10, wherein the alternating stack {(132, 146) and/or (232, 246)} includes a staircase region in which each electrically conductive layer (146, 246) except a topmost electrically conductive layer 246 laterally extends farther than any overlying electrically conductive layer (146, 246) to provide multiple sets of stepped surfaces, wherein each set of stepped surfaces continuously extend from a bottommost layer of the alternating stack {(132, 146) and/or (232, 246)} to a topmost layer of the alternating stack {(132, 146) and/or (232, 246)}; a retro-stepped dielectric material portion 265 overlying the multiple sets of stepped surfaces; an array of memory stack structures (55, 60) extending through the alternating stack {(132, 146) and/or (232, 246)}; and semiconductor-containing support structures 20 extending through the multiple sets of stepped surfaces. Each semiconductor-containing support structure 20 and each memory stack structure (50, 60) comprises a respective instance of a memory film 50 and a respective instance of a vertical semiconductor channel 60 that is laterally surrounded by the respective instance of the memory film 50 and contacts a bottom surface of a respective instance of a drain region 63. Each horizontal surface within the multiple sets of stepped surfaces includes an M×N array of openings, wherein M is an integer greater than 2 and N is an integer greater than 1. An instance of an M×N array of semiconductor-containing support structures 20 that is a subset of the semiconductor-containing support structures 20 extends vertically through each opening in the M×N array of openings.

In one embodiment, each instance of the vertical semiconductor channel 60 in the memory stack structures (50, 60) is electrically shorted to a respective one 95 of the upper-interconnect-level metal interconnect structures (92, 94, 95, 96, 98) in an upper-interconnect-level metal interconnect layer 90, and an entirety of a top planar surface of each semiconductor-containing support structure 20 contacts a respective bottom surface of the upper-interconnect-level dielectric material layer 90.

In one embodiment, the three-dimensional memory device can further comprise contact via structures 86 vertically extending from a top surface of the retro-stepped dielectric material portion 265 to a respective region of the multiple sets of stepped surfaces and contacting a respective one of the electrically conductive layers (146, 246). A subset of horizontal surfaces within one set among the multiple sets of stepped surfaces includes a respective horizontal surface including a first opening through which a respective one of the contact via structures 86 extends vertically and a respective M×N array of openings (which are second openings) as illustrated in insets A in FIGS. 18 and 19. In one embodiment, each instance of the M×N array of semiconductor-containing support structures 20 can be located in a continuous volume V (shown in insets A and B of FIGS. 18 and 19), which may be a cylindrical volume, that does not include any of the contact via structures 86 and is homeomorphic to a sphere. As used herein, an element is "homeomorphic" to a shape if the element can be continuously deformed without creating an additional opening or destroying any pre-existing opening to the shape. Thus, a cylindrical volume is homeomorphic to a sphere.

As in the first exemplary structures, laterally-insulated conductive via structures (26, 28) can be provided, which vertically extend through each layer in the alternating stack {(132, 146) and/or (232, 246)} and through the semiconductor material layer 10, wherein each of the laterally-insulated conductive via structures (26, 28) comprises a respective first conductive core 28 that is electrically shorted to a respective one of the lower-interconnect-level metal interconnect structures 780, and a respective first cylindrical dielectric spacer 26 that laterally surrounds the respective first conductive core 28. In one embodiment, each first conductive core 28 contacts a bottom surface of a respective one 98 of upper-interconnect-level metal interconnect structures (92, 94, 95, 96, 98) that are embedded within the overlying upper-interconnect-level dielectric material layer 90. In some embodiments, a bottommost surface of each second conductive core 128 can be located between a first horizontal plane including a bottommost surface of the semiconductor material layer 10 and a second horizontal plane including a topmost surface of the semiconductor material layer 10. The three-dimensional memory device can further comprise backside trenches 79 laterally extending along a horizontal direction hd1 and vertically extending through an entirety of the alternating stack {(132, 146) and/or (232, 246)}. Each set of stepped surfaces is laterally bounded by a neighboring pair of the backside trenches 79.

In one embodiment, each memory stack structure (50, 60) within the array includes a vertical semiconductor channel 60 electrically connected to the semiconductor material layer 10, and a driver circuit for the array of memory stack structures (50, 60) is located on a top surface of the semiconductor substrate 9, and is electrically connected to at least one of the electrically conductive layers (146, 246) in the alternating stack {(132, 146) and/or (232, 246)} and drain regions 63 overlying vertical semiconductor channels 60 within the memory stack structures (50, 60) through a subset of the lower-interconnect-level metal interconnect structures 780. In other words, the driver circuit can be electrically connected to the word lines and/or the bit lines of the array of memory stack structures (50, 60).

In one embodiment, the three-dimensional memory device can comprise a monolithic three-dimensional NAND memory device; the electrically conductive layers (146, 246) can comprise, or can be electrically connected to, a respective word line of the monolithic three-dimensional NAND memory device; the semiconductor substrate 9 can comprise a silicon substrate; the monolithic three-dimensional NAND memory device comprises an array of monolithic three-dimensional NAND strings over the silicon substrate; and at least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon; the electrically conductive layers (146, 246) can comprise a plurality of control gate electrodes having a strip shape extending substantially parallel to the top surface of the semiconductor substrate 10; and the plurality of control gate electrodes comprise at least a first control gate electrode located in the first device level and a second control gate electrode located in the second device level. The array of monolithic three-dimensional NAND strings can comprise: a plurality of semiconductor channels (the vertical semiconductor channels 60 and optionally horizontal semiconductor channels that are surface portions of the semiconductor material layer 10), wherein at least one end portion of each of the plurality of semiconductor channels extends substantially perpendicular to a top surface of the semiconductor substrate 9, and a plurality of charge storage elements (as embodied as portions of the memory material layer 54 located at levels of the electrically conductive layers (146, 246), each charge storage element located adjacent to a respective one of the plurality of semiconductor channels.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a lower-interconnect-level dielectric material layer located over a substrate and embedding lower-interconnect-level metal interconnect structures;
a horizontal layer overlying the lower-interconnect-level dielectric material layer;
an alternating stack of insulating layers and electrically conductive layers located over the horizontal layer;
an array of memory stack structures extending through the alternating stack;
laterally-insulated conductive via structures that vertically extend through each layer in the alternating stack and through the horizontal layer, wherein each of the laterally-insulated conductive via structures comprises a respective first conductive core that is electrically shorted to a respective one of the lower-interconnect-level metal interconnect structures, and a respective first cylindrical dielectric spacer that laterally surrounds the respective first conductive core;
laterally-insulated support structures that vertically extend through a subset of layers in the alternating stack, wherein each of the laterally-insulated support structures comprises a respective second conductive core having a same composition as the first conductive core, and a respective second cylindrical dielectric spacer that laterally surrounds the respective second conductive core, and wherein an entirety of a top planar surface of each second conductive core contacts a respective bottom surface of an overlying upper-interconnect-level dielectric material layer;
wherein:
the alternating stack includes a staircase region in which each electrically conductive layer except a topmost electrically conductive layer laterally extends farther than any overlying electrically conductive layer to provide multiple sets of stepped surfaces, wherein each set of stepped surfaces continuously extend from a bottommost layer of the alternating stack to a topmost layer of the alternating stack;
a retro-stepped dielectric material portion overlies the multiple sets of stepped surfaces; and
the laterally-insulated support structures vertically extend through a respective portion of the multiple sets of stepped surfaces and the retro-stepped dielectric material portion.

2. The three-dimensional memory device of claim 1, wherein each first conductive core contacts a bottom surface of a respective one of upper-interconnect-level metal interconnect structures that are embedded within the overlying upper-interconnect-level dielectric material layer.

3. The three-dimensional memory device of claim 1, wherein a bottommost surface of each second conductive core is located between a first horizontal plane including a bottommost surface of the horizontal layer and a second horizontal plane including a topmost surface of the horizontal layer.

4. The three-dimensional memory device of claim 1, wherein:
a bottommost surface of each second conductive core contacts a respective metallic material portion embedded within the lower-interconnect-level dielectric material layer; and
each second conductive core is electrically isolated from any conductive or semiconducting material within the substrate, the horizontal layer, the alternating stack, or upper-interconnect-level metal interconnect structures located over the alternating stack.

5. The three-dimensional memory device of claim 1, further comprising:
contact via structures vertically extending from a top surface of the retro-stepped dielectric material portion to a respective region of the multiple sets of stepped surfaces and contacting a respective one of the electrically conductive layers, wherein a subset of horizontal surfaces within one set among the multiple sets of stepped surfaces includes a respective horizontal surface including a first opening through which a respective one of the contact via structures extends vertically and a second opening through which a respective one of the laterally-insulated support structures extends vertically; and
backside trenches laterally extending along a horizontal direction and vertically extending through an entirety of the alternating stack, wherein each set of stepped surfaces is laterally bounded by a neighboring pair of the backside trenches.

6. The three-dimensional memory device of claim 5, wherein a complementary subset of horizontal surfaces within the one set among the multiple sets of stepped surfaces includes openings through which a respective one of the laterally-insulated support structures extend vertically, and does not contact any of the contact via structures, wherein the complementary subset of horizontal surfaces and the set of horizontal surfaces collectively comprise all horizontal surfaces of the one set among the multiple sets of stepped surfaces.

7. The three-dimensional memory device of claim 5, further comprising semiconductor-containing support structures extending through the multiple sets of stepped surfaces, wherein:
each semiconductor-containing support structure and each memory stack structure comprises a respective instance of a memory film and a respective instance of a vertical semiconductor channel that is laterally surrounded by the respective instance of the memory film and contacts a bottom surface of a respective instance of a drain region; and
each horizontal surface within the multiple sets of stepped surfaces includes at least one opening through which a respective one of the semiconductor-containing support structures extends vertically.

8. The three-dimensional memory device of claim 5, wherein:
electrically conductive layers comprise word lines extending in a word line direction; and
each row extending in the word line direction contains alternating laterally-insulated conductive via structures and laterally-insulated support structures.

9. The three-dimensional memory device of claim 5, wherein the contact via structures vertically extend in a first-type contact via region and a second-type contact via region having a two-fold rotational symmetry around a vertical axis.

10. The three-dimensional memory device of claim 1, wherein:
the substrate comprises a semiconductor substrate;
the horizontal layer comprises an electrically conductive buried source line;
each memory stack structure within the array includes a vertical semiconductor channel electrically connected to the horizontal layer; and a driver circuit for the array of memory stack structures is located on a top surface of the semiconductor substrate and is electrically connected to at least one of the electrically conductive layers in the alternating stack and drain regions overlying vertical semiconductor channels within the memory stack structures through a subset of the lower-interconnect-level metal interconnect structures.

11. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the semiconductor substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the semiconductor substrate, and
a plurality of charge storage elements, each charge storage element located adjacent to a respective one of the plurality of semiconductor channels.

* * * * *